United States Patent
Pikulin et al.

(10) Patent No.: US 11,808,796 B2
(45) Date of Patent: **\*Nov. 7, 2023**

(54) PRE-SCREENING AND TUNING HETEROJUNCTIONS FOR TOPOLOGICAL QUANTUM COMPUTER

(71) Applicant: Microsoft Technology Licensing, LLC, Redmond, WA (US)

(72) Inventors: Dmitry Pikulin, Vancouver (CA); Mason L Thomas, Santa Barbara, CA (US); Chetan Vasudeo Nayak, Santa Barbara, CA (US); Roman Mykolayovych Lutchyn, Santa Barbara, CA (US); Bas Nijholt, Delft (NL); Bernard Van Heck, Rotterdam (NL); Esteban Adrian Martinez, Copenhagen (DK); Georg Wolfgang Winkler, Santa Barbara, CA (US); Gijsbertus De Lange, Zoetermeer (NL); John David Watson, Delft (NL); Sebastian Heedt, Breda (NL); Torsten Karzig, Goleta, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/651,222

(22) Filed: Feb. 15, 2022

(65) Prior Publication Data

US 2022/0299551 A1    Sep. 22, 2022

Related U.S. Application Data

(60) Provisional application No. 63/161,946, filed on Mar. 16, 2021.

(51) Int. Cl.
*G01R 27/28* (2006.01)
*G01R 27/02* (2006.01)
(Continued)

(52) U.S. Cl.
CPC .............. *G01R 27/02* (2013.01); *G01R 27/28* (2013.01); *G01R 27/32* (2013.01); *G01R 35/005* (2013.01);
(Continued)

(58) Field of Classification Search
CPC .... G01R 27/02; G01R 31/2637; G01R 27/28; G01R 27/32; G01R 35/005; G01R 27/04;
(Continued)

(56) References Cited

U.S. PATENT DOCUMENTS 10,204,199 B2   2/2019   Sarpeshkar
2002/0121636 A1   9/2002   Amin et al.
(Continued)

FOREIGN PATENT DOCUMENTS

WO   2020018260 A1   1/2020
WO   2021178060 A1   9/2021

OTHER PUBLICATIONS

Lai, et al., "Presence Versus Absence of End-to-End Nonlocal Conductance Correlations in Majorana Nanowires; Majorana Bound States Versus Andreev Bound States", In Journal of Physical Review B, vol. 100, Issue 4, Jul. 3, 2019, 15 Pages.
(Continued)

*Primary Examiner* — Raul J Rios Russo
(74) *Attorney, Agent, or Firm* — Alleman Hall Creasman & Tuttle LLP

(57) ABSTRACT

A method to evaluate a semiconductor-superconductor heterojunction for use in a qubit register of a topological quantum computer includes (a) measuring one or both of a radio-frequency (RF) junction admittance of the semicon-
(Continued)

ductor-superconductor heterojunction and a sub-RF conductance including a non-local conductance of the semiconductor-superconductor heterojunction, to obtain mapping data and refinement data; (b) finding by analysis of the mapping data one or more regions of a parameter space consistent with an unbroken topological phase of the semiconductor-superconductor heterojunction; and (c) finding by analysis of the refinement data a boundary of the unbroken topological phase in the parameter space and a topological gap of the semiconductor-superconductor heterojunction for at least one of the one or more regions of the parameter space.

18 Claims, 20 Drawing Sheets

(51) Int. Cl.
| | |
|---|---|
| *G06N 10/20* | (2022.01) |
| *G01R 27/32* | (2006.01) |
| *G01R 35/00* | (2006.01) |
| H10N 60/12 | (2023.01) |
| H10N 69/00 | (2023.01) |
| G01R 27/04 | (2006.01) |
| G01R 27/16 | (2006.01) |

(52) U.S. Cl.
CPC ............ *G06N 10/20* (2022.01); *G01R 27/04* (2013.01); *G01R 27/16* (2013.01); *H10N 60/12* (2023.02); *H10N 69/00* (2023.02)

(58) Field of Classification Search
CPC ........ G01R 27/16; G06N 10/20; G06N 10/40; G06N 10/70; H10N 60/12; H10N 69/00
USPC ........... 324/76.11–76.83, 459, 600, 649, 650
See application file for complete search history.

(56) References Cited

U.S. PATENT DOCUMENTS

| | | | |
|---|---|---|---|
| 2002/0188578 A1 | 12/2002 | Amin et al. | |
| 2003/0111661 A1 | 6/2003 | Tzalenchuk et al. | |
| 2009/0079421 A1 | 3/2009 | Freedman et al. | |
| 2013/0299783 A1* | 11/2013 | Lutchyn ............... | H10N 60/128 257/31 |
| 2014/0297708 A1 | 10/2014 | Svore et al. | |
| 2017/0228483 A1 | 8/2017 | Rigetti et al. | |
| 2019/0220769 A1* | 7/2019 | Pikulin .................. | G06N 10/00 |
| 2020/0098821 A1* | 3/2020 | Freedman ............ | H10N 60/128 |
| 2021/0005661 A1* | 1/2021 | Freedman .............. | H10N 69/00 |
| 2021/0279626 A1* | 9/2021 | Pikulin ................ | G06F 9/30101 |
| 2021/0279627 A1* | 9/2021 | Bauer ..................... | G06N 10/70 |

OTHER PUBLICATIONS

Akhmerov, et al., "Quantized Conductance at the Majorana Phase Transition in a Disordered Superconducting Wire", In Journal of Physical Review Letters, vol. 106, Issue 5, Jan. 31, 2011, 4 Pages.
Albrecht, et al., "Exponential Protection of Zero Modes in Majorana Islands", In Journal of Nature, vol. 531, Issue 7593, Mar. 10, 2016, 18 Pages.
Alicea, Jason, "New Directions in the Pursuit of Majorana Fermions in Solid State Systems", In Journal of Reports on Progress in Physics, vol. 75, Jun. 28, 2012, 36 Pages.
Anselmetti, et al., "End-to-End Correlated Subgap States in Hybrid Nanowires", In Journal of Physical Review B, vol. 100, Issue 20, Nov. 12, 2019, 6 Pages.
Bagrets, et al., "Class D Spectral Peak in Majorana Quantum Wires", In Journal of Physical Review Letters, vol. 109, Issue 22, Nov. 29, 2012, 5 Pages.
Bolech, et al., "Observing Majorana Bound States in p-Wave Superconductors Using Noise Measurements in Tunneling Experiments", In Journal of Physical Review Letters, vol. 98, Issue 23, Jun. 5, 2007, 4 Pages.
Bonderson, et al., "Measurement-Only Topological Quantum Computation", In Journal of Physical Review Letters, vol. 101, Issue 1, Jun. 30, 2008, 4 Pages.
Brouwer, et al., "Probability Distribution of Majorana End-State Energies in Disordered Wires", In Journal of Physical Review Letters, vol. 107, Issue 19, Nov. 1, 2011, 4 Pages.
Brouwer, et al., "Topological Superconducting Phases in Disordered Quantum Wires With Strong Spin-Orbit Coupling", In Journal of Physical Review B, vol. 84, Issue 14, Oct. 31, 2011, 6 Pages.
Chang, et al., "Hard Gap in Epitaxial Semiconductor-Superconductor Nanowires", In Journal of Nature Nanotechnology, vol. 10, Jan. 12, 2015, pp. 232-236.
Chen, et al., "Ubiquitous Non-Majorana Zero-Bias Conductance Peaks in Nanowire Devices", In Journal of Physical Review Letters, vol. 123, Issue 10, Sep. 6, 2019, 6 Pages.
Chiu, et al., "Conductance of a Superconducting Coulomb-Blockaded Majorana Nanowire", In Journal of Physical Review B, vol. 96, Issue 5, Aug. 4, 2017, 23 Pages.
Choy, et al., "Majorana Fermions Emerging from Magnetic Nanoparticles on a Superconductor without Spin-orbit Coupling", In Journal of Physical Review B, vol. 84, Issue 19, Nov. 9, 2011, 6 Pages.
Churchill, et al., "Superconductor-Nanowire Devices from Tunneling to the Multichannel Regime: Zero-Bias Oscillations and Magnetoconductance Crossover", In Journal of Physical Review B, vol. 87, Issue 24, Jun. 6, 2013, 6 Pages.
Danon, et al., "Nonlocal Conductance Spectroscopy of Andreev Bound States: Symmetry Relations and BCS Charges", In Journal of Physical Review Letters vol. 124, Issue 3, Jan. 22, 2020, 6 Pages.
Das, et al., "Zero-Bias Peaks and Splitting in An Al—InAs Nanowire Topological Superconductor as a Signature of Majorana Fermions", In Journal of Nature Physics, vol. 8, Issue 12, Nov. 11, 2012, 9 Pages.
Degottardi, et al., "Topological Phases, Majorana Modes and Quench Dynamics in a Spin Ladder System", In New Journal of Physics, vol. 13, Issue 6, Jun. 30, 2011, 23 Pages.
Deng, et al., "Supporting Information: Anomalous Zero-Bias Conductance Peak In A Nb—InSb Nanowire-Nb Hybrid Device", In Journal of Nano Letters, vol. 12, Issue 12, Nov. 21, 2012, 17 Pages.
Deng, et al., "Majorana Bound State in a Coupled Quantum-dot Hybrid-nanowire System", In Journal of Science, vol. 354, Issue 6319, Dec. 23, 2016, pp. 1557-1562.
Denisov, et al., "Charge-Neutral Nonlocal Response in Superconductor-InAs Nanowire Hybrid Devices", In Repository of arXiv:2101.02128v2, Aug. 2, 2021, 10 Pages.
Fornieri, et al., "Evidence of Topological Superconductivity in Planar Josephson Junctions", In Journal of Nature, vol. 569, Issue 7754, May 2, 2019, 16 Pages.
Freedman, et al., "Topological Quantum Computation", In Bullentin (New Series) of the American Mathematical Society, vol. 40, Issue 1, Oct. 10, 2002, pp. 31-38.
Fu, et al., "Josephson Current and Noise at a Superconductor/Quantum-Spin-Hall-Insulator/Superconductor Junction", In Journal of Physical Review B, vol. 79, Issue 16, Apr. 28, 2009, 4 Pages.
Fu, et al., "Superconducting Proximity Effect and Majorana Fermions at the Surface of a Topological Insulator", In Journal of Physical Review Letters, vol. 100, Issue 9, Mar. 6, 2008, 4 Pages.
Fulga, et al., "Scattering Formula for the Topological Quantum Number of a Disordered Multimode Wire", In Journal of Physical Review B, vol. 83, Issue 15, Apr. 18, 2011, 8 Pages.
Gazibegovic, et al., "Epitaxy of Advanced Nanowire Quantum Devices", In Journal of Nature, vol. 548, Issue 7668, Aug. 24, 2017, 15 Pages.
Groth, et al., "Kwant: A Software Package for Quantum Transport", In New Journal of Physics, vol. 16, Issue 6, Jun. 26, 2014, 40 Pages.
Groth, et al., "Theory of the Topological Anderson Insulator", In Journal of Physical Review Letters, vol. 103, Issue 19, Nov. 6, 2009, 4 Pages.

(56) References Cited

OTHER PUBLICATIONS

Gül, et al., "Hard Superconducting Gap in InSb Nanowires", In Journal of Nano Letter, vol. 17, Issue 4, Mar. 29, 2017, pp. 2690-2696.

Harabula, et al., "Measuring a Quantum Dot with an Impedance-Matching On-Chip Superconducting LC Resonator at Gigahertz Frequencies", In Journal of Physical Review Applied, vol. 8, Issue 5, Nov. 6, 2017, 6 Pages.

Hyart, et al., "Flux-controlled Quantum Computation with Majorana Fermions", In Journal of Physical Review B, vol. 88, Issue 3, Jul. 17, 2013, 17 Pages.

Ioselevich, et al., "Majorana State on the Surface of a Disordered Three-Dimensional Topological Insulator", In Journal of Physical Review B, vol. 86, Issue 3, Jul. 26, 2012, 10 Pages.

Ivanov, D. A., "Non-Abelian Statistics of Half-Quantum Vortices in p-Wave Superconductors", In Journal of Physical Review Letters, vol. 86, Issue 2, Jan. 8, 2001, pp. 268-271.

Karzig, et al., "Quasiparticle Poisoning of Majorana Qubits", In Journal of Physical Review Letters, vol. 126, Issue 5, Feb. 4, 2021, 7 Pages.

Karzig, et al., "Scalable Designs for Quasiparticle-poisoning-protected Topological Quantum Computation with Majorana Zero Modes", In Journal of Physical Review B, vol. 95, Issue 23, Jun. 21, 2017, 32 Pages.

Kells, et al., "Near-Zero-Energy End States in Topologically Trivial Spin-Orbit Coupled Superconducting Nanowires with a Smooth Confinement", In Journal of Physical Review B, vol. 86, Issue 10, Sep. 12, 2012, 5 Pages.

Kitaev, A. Yu, "Unpaired Majorana Fermions in Quantum Wires", In Journal of Physics-Uspekhi, vol. 44, Oct. 1, 2001, pp. 131-136.

Suominen, et al., "Zero-Energy Modes from Coalescing Andreev States in a Two-Dimensional Semiconductor-Superconductor Hybrid Platform", In Journal of Physical Review Letters, vol. 119, Issue 17, Oct. 26, 2017, 5 Pages.

Kopnin, et al., "Mutual Friction in Superfluid He: Effects of Bound States in the Vortex Core", In Journal of Physical Review B, vol. 44, Issue 17, Nov. 1, 1991, pp. 9667-9677.

Kringhøj, et al., "Andreev Modes from Phase Winding in a Full-Shell Nanowire-Based Transmon", In Journal of Physical Review Letters, vol. 126, Issue 4, Jan. 29, 2021, 6 Pages.

Krogstrup, et al., "Epitaxy of Semiconductor-superconductor Nanowires", In Journal of Nature Materials, vol. 14, Jan. 12, 2015, pp. 400-406.

Kwon, et al., "Fractional Ac Josephson Effect In P- and D-Wave Superconductors", In the European Physical Journal B—Condensed Matter and Complex Systems, Jan. 23, 2013, pp. 349-361.

Nijholt, et al., "python-adaptive/adaptive: version 0.7.3", Retrieved from: https://web.archive.org/web/20200225104122/https://zenodo.org/record/2552292#.XIT57j3P02w, Jan. 29, 2019, 2 Pages.

Laroche, et al., "Observation of the 4π-Periodic Josephson Effect In Indium Arsenide Nanowires", In Journal of Nature Communications, vol. 10, Jan. 16, 2019, 7 Pages.

Law, et al., "Majorana Fermion Induced Resonant Andreev Reflection", In Journal of Physical Review Letters, vol. 103, Issue 23, Dec. 2, 2009, 4 Pages.

Lee, et al., "Spin-Resolved Andreev Levels and Parity Crossings in Hybrid Superconductor-Semiconductor Nanostructures", In Journal of Nature Nanotechnology, Dec. 15, 2013, pp. 79-83.

Liu, et al., "Andreev Bound States Versus Majorana Bound States In Quantum Dot-Nanowire-Superconductor Hybrid Structures: Trivial Versus Topological Zero-Bias Conductance Peaks", In Journal of Physical Review B, vol. 96, Issue 7, Aug. 30, 2017, 29 Pages.

Liu, et al., "Zero-Bias Peaks in the Tunneling Conductance of Spin-Orbit-Coupled Superconducting Wires with and without Majorana End-States", In Journal of Physical Review Letters, vol. 109, Issue 26, Dec. 28, 2012, 5 Pages.

Lobos, et al., "Interplay of Disorder and Interaction in Majorana Quantum Wires", In Journal of Physical Review Letters, vol. 109, Issue 14, Oct. 5, 2012, 5 Pages.

Winkler, et al., "Unified Numerical Approach to Topological Semiconductor-Superconductor Heterostructures", In Journal of Physical Review B, vol. 99, Issue 24, Jun. 13, 2019, 14 Pages.

Woods, et al., "Zero-Energy Pinning of Topologically Trivial Bound States In Multiband Semiconductor-Superconductor Nanowires", In Journal of Physical Review B, vol. 100, Issue 12, Sep. 6, 2019, 17 Pages.

Mi, et al., "X-Shaped and Y-Shaped Andreev Resonance Profiles in a Superconducting Quantum Dot", In Journal of Experimental and Theoretical Physics, vol. 119, Jan. 22, 2015, pp. 1018-1027.

Zhang, et al., "Retraction Note: Quantized Majorana Conductance", In Journal of Nature, vol. 591, Mar. 25, 2021, 1 Page.

Lutchyn, et al., "Majorana Fermions and a Topological Phase Transition in Semiconductor-Superconductor Heterostructures", In Journal of Physical Review Letters, vol. 105, Issue 7, Aug. 13, 2010, 4 Pages.

Lutchyn, et al., "Majorana Zero Modes in Superconductor-semiconductor Heterostructures", In Journal of Nature Reviews Materials, May 1, 2018, 20 Pages.

Lutchyn, et al., "Momentum Relaxation in a Semiconductor Proximity-Coupled to a Disordered S-Wave Superconductor: Effect of Scattering on Topological Superconductivity", In Journal of Physical Review B, vol. 85, Issue 14, Apr. 24, 2012, 5 Pages.

Lutchyn, et al., "Realizing Majorana Zero Modes in Superconductor-Semiconductor Heterostructures", In Repository of arXiv:1707.04899v1, Jul. 16, 2017, 18 Pages.

Martinez, et al., "Measurement Circuit Effects in Three-Terminal Electrical Transport Measurements", In Repository of arXiv:2104.02671v1, Apr. 6, 2021, 5 Pages.

Menard, et al., "Conductance-Matrix Symmetries of a Three-Terminal Hybrid Device", In Repository of arXiv: 1905.05505, May 14, 2019, 8 Pages.

Zhang, et al., "Ballistic Superconductivity in Semiconductor Nanowires", In Journal of Nature Communications, vol. 8, Issue 1, Jul. 6, 2017, 7 Pages.

Mishmash, et al., "Dephasing and Leakage Dynamics of Noisy Majorana-based Qubits: Topological Versus Andreev", In Journal of Physical Review B, vol. 101, Issue 7, Feb. 3, 2020, 21 Pages.

Moore, et al., "Quantized Zero-Bias Conductance Plateau in Semiconductor-Superconductor Heterostructures without Topological Majorana Zero Modes", In Journal of Physical Review B, vol. 98, Issue 15, Oct. 19, 2018, 6 Pages.

Motrunich, et al., "Griffiths Effects and Quantum Critical Points in Dirty Superconductors without Spin-Rotation Invariance: One-Dimensional Examples", In Journal of Physical Review B, vol. 63, Issue 22, May 22, 2001, 13 Pages.

Mourik, et al., "Signatures of Majorana Fermions in Hybrid Superconductor-Semiconductor Nanowire Devices", In Journal of Science, vol. 336, May 25, 2012, pp. 1003-1007.

Nadj-Perge, et al., "Proposal for Realizing Majorana Fermions in Chains of Magnetic Atoms on a Superconductor", In Journal of Physical Review B, vol. 88, Issue 2, Jul. 25, 2013, 5 Pages.

Nayak, et al., "Non-Abelian Anyons and Topological Quantum Computation", In Journal of Reviews of Modern Physics vol. 80, Issue 3, Jul. 2008, pp. 1083-1159.

Nichele, et al., "Scaling of Majorana Zero-Bias Conductance Peaks", In Journal of Physical Review Letters, vol. 119, Issue 13, Sep. 29, 2017, 5 Pages.

Nijholt, et al., "Orbital Effect of Magnetic Field on the Majorana Phase Diagram", In Journal of Physical Review B, vol. 93, Issue 23, Jun. 20, 2016, 6 Pages.

D'Farrell, et al., "Hybridization of Subgap States in One-Dimensional Superconductor-Semiconductor Coulomb Islands", In Journal of Physical Review Letters, vol. 121, Issue 25, Dec. 19, 2018, 5 Pages.

Oreg, et al., "Helical Liquids and Majorana Bound States in Quantum Wires", In Journal of Physical Review Letters, vol. 105, Issue 17, Oct. 20, 2010, 4 Pages.

Pan, et al., "Physical Mechanisms for Zero-Bias Conductance Peaks in Majorana Nanowires", In Journal of Physical Review Research, vol. 2, Issue 1, Mar. 30, 2020, 33 Pages.

Pan, et al., "Three-Terminal Nonlocal Conductance in Majorana Nanowires: Distinguishing Topological and Trivial in Realistic

(56) References Cited

OTHER PUBLICATIONS

Systems with Disorder and Inhomogeneous Potential", In Journal of Physical Review B, vol. 103, Issue 1, Jan. 20, 2021, 25 Pages.
Zhang, et al., "Large Zero-Bias Peaks In InSb—Al Hybrid Semiconductor-Superconductor Nanowire Devices", In Repository of arXiv:2101.11456, Jan. 27, 2021, 36 Pages.
"International Search Report and Written Opinion Issued in PCT Application No. PCT/US22/019949", dated Jul. 12, 2022, 13 Pages.
Pedregosa, et al., "Scikit-learn: Machine Learning in Python", In Journal of Machine Learning Research, vol. 12, Nov. 1, 2011, pp. 2825-2830.
Pikulin, et al., "A Zero-Voltage Conductance Peak from Weak Antilocalization in a Majorana Nanowire", In New Journal of Physics, vol. 14, Issue 12, Dec. 18, 2012, 22 Pages.
Pikulin, et al., "Protocol to Identify a Topological Superconducting Phase in a Three-Terminal Device", In Repository of arXiv:2103.122171, Mar. 22, 2021, 28 Pages.
Plugge, et al., "Majorana Box Qubits", In New Journal of Physics, vol. 19, Issue 1, Jan. 11, 2017, 15 Pages.
Puglia, et al., "Closing of the Induced Gap in a Hybrid Superconductor-Semiconductor Nanowire", In Repository of arXiv:2006.01275v1, Jun. 1, 2020, 11 Pages.
Razmadze, et al., "Radio-Frequency Methods for Majorana-Based Quantum Devices: Fast Charge Sensing and Phase-Diagram Mapping", In Journal of Physical Review Applied, vol. 11, Issue 6, Jun. 5, 2019, 9 Pages.
Read, et al., "Paired States of Fermions in Two Dimensions with Breaking of Parity and Time-reversal Symmetries and the Fractional Quantum Hall Effect", In Journal of Physical Review B, vol. 61, Issue 15, Apr. 15, 2000, pp. 10267-10297.
Reeg, et al., "Zero-Energy Andreev Bound States from Quantum Dots In Proximitized Rashba Nanowires", In Journal of Physical Review B, vol. 98, Issue 24, Dec. 7, 2018, 12 Pages.
Reilly, et al., "Fast Single-Charge Sensing with a RF Quantum Point Contact", In Journal of Applied Physics Letters, vol. 91, Oct. 15, 2007, 3 Pages.
Rokhinson, et al., "The Fractional A.C. Josephson Effect in a Semiconductor-Superconductor Nanowire as a Signature of Majorana Particles", In Journal of Nature Physics, vol. 8, Sep. 23, 2012, pp. 795-799.
Rosdahl, et al., "Andreev Rectifier: A Nonlocal Conductance Signature of Topological Phase Transitions", In Journal of Physical Review B, vol. 97, Jan. 22, 2018, 11 Pages.
Sabonis, et al., "Destructive Little-Parks Effect in a Full-Shell Nanowire-Based Transmon", In Journal of Physical Review Letters, vol. 125, Issue 15, Oct. 9, 2020, 5 Pages.
Sarma, et al., "Majorana Zero Modes and Topological Quantum Computation", In Journal of NPJ Quantum Information, vol. 1, Issue 1, Oct. 27, 2015, 13 Pages.
Sau, et al., "Density of States of Disordered Topological Superconductor-Semiconductor Hybrid Nanowires", In Journal of Physical Review B, vol. 88, Issue 6, Aug. 12, 2013, 7 Pages.
Sau, et al., "Generic New Platform for Topological Quantum Computation Using Semiconductor Heterostructures", In Journal of Physical Review Letters, vol. 104, Issue 4, Jan. 27, 2010, 4 Pages.
Shen, et al., "A Full Parity Phase Diagram of a Majorana Island", In Repository of arXiv:2012.10118v1, Dec. 18, 2020, 16 Pages.
Shen, et al., "Parity Transitions in the Superconducting Ground State of Hybrid InSb—Al Coulomb Islands", In Journal of Nature Communications, vol. 9, Issue 1, Nov. 15, 2018, 8 Pages.

Stanescu, et al., "Majorana Fermions in Semiconductor Nanowires", In Journal of Physical Review Letters B, vol. 84, Issue 14, Oct. 28, 2011, 29 Pages.
Stanescu, et al., "Robust Low-Energy Andreev Bound States in Semiconductor-Superconductor Structures: Importance of Partial Separation of Component Majorana Bound States", In Journal of Physical Review B, vol. 100, Issue 15, Oct. 28, 2019, 21 Pages.
Zanten, et al., "Photon Assisted Tunneling of Zero Modes in a Majorana Wire", In Journal of Nature Physics, vol. 16, Jun. 2020, pp. 663-668.
Takei, et al., "Soft Superconducting Gap in Semiconductor Majorana Nanowires", In Journal of Physical Review Letters, vol. 110, Issue 18, Apr. 30, 2013, 5 Pages.
Vaitiekēnas, et al., "Flux-Induced Topological Superconductivity In Full-Shell Nanowires", In Journal of Science, vol. 367, Issue 6485, Mar. 27, 2020, 12 Pages.
Vaitiekēnas, et al., "Selective-Area-Grown Semiconductor-Superconductor Hybrids: A Basis for Topological Networks", In Journal of Physical Review Letters, vol. 121, Issue 14, Oct. 3, 2018, 5 Pages.
Valentini, et al., "Nontopological Zero-Bias Peaks In Full-Shell Nanowires Induced By Flux-Tunable Andreev States", In Repository of arXiv:2008.02348v2, Oct. 9, 2020, 25 Pages.
Virtanen, et al., "SciPy 1.0: Fundamental Algorithms for Scientific Computing in Python", In Journal of Nature Methods, vol. 17, Mar. 2020, pp. 261-272.
Volovik, Grigory E., "The Universe in a Helium Droplet", In Journal of International Series of Monographs on Physics, vol. 117, 2003, 526 Pages.
Vuik, et al., "Reproducing Topological Properties with Quasi-Majorana States", In Journal of SciPost Physics, vol. 7, Issue 5, Nov. 12, 2019, 24 Pages.
Wiedenmann, et al., "4π-Periodic Josephson Supercurrent in HgTe-Based Topological Josephson Junctions", In Journal of Nature Communications, vol. 7, Jan. 21, 2016, 7 Pages.
"AFS4-00100800-14-10P-4", Retrieved from: https://www.everythingrf.com/products/microwave-rf-amplifiers/miteq/567-74-afs4-00100800-14-10p-4, Retrieved Date: May 19, 2020, 5 Pages.
"Notice of Allowance Issued in U.S. Appl. No. 16/886,670", dated Jun. 23, 2021, 10 Pages.
Beri, et al., "Topological Kondo Effect with Majorana Fermions", In Repository of arXiv:1206.2224v1, Jun. 11, 2012, 6 Pages.
Peng, et al., "Signatures of Topological Josephson Junctions", In Journal of American Physical Society, vol. 94, Issue 8, Aug. 11, 2016, 22 Pages.
Buonacorsi, et al., "Network Architecture for a Topological Quantum Computer Silicon", In Repository of arXiv:1807.09941v1, Jul. 26, 2018, 34 Pages.
"International Search Report and Written Opinion issued in PCT Application No. PCT/US2021/014194", dated May 12, 2021, 14 Pages.
Han, et al., "Radio-frequency Measurement in Semiconductor Quantum Computation", In Journal of Science China Physics, vol. 60, Issue 5, May 1, 2017, 13 Pages.
Hu, et al., "Observation of Quantum Susceptance in Superconducting Tunnel Junctions", In Publication of University of California Lawrence Berkeley Laboratory, Dec. 20, 1989, 23 Pages.
Pan, et al., "Zero-Bias Conductance Peaks in Majorana Nanowires: The Good, The Bad, and The Ugly", In Repository of arXiv:1910.11413v1, Oct. 24, 2019, 32 Pages.
Li, et al., "Topological Phase in Kitaev Chain with Imbalanced Pairing", In Repository of arXiv:1707.04718v1, Jul. 15, 2017, 8 Pages.

* cited by examiner

PRE-SCREENING AND TUNING HETEROJUNCTIONS FOR TOPOLOGICAL QUANTUM COMPUTER

CROSS REFERENCE TO RELATED APPLICATION

This application claims priority to U.S. Provisional Patent Application Ser. No. 63/161,946 filed 16 Mar. 2021 and entitled PRE-SCREENING AND TUNING HETEROJUNCTIONS FOR TOPOLOGICAL QUANTUM COMPUTER, the entirety of which is hereby incorporated herein by reference for all purposes.

BACKGROUND

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and machine learning. Furthermore, it has been predicted that continued miniaturization of conventional computer logic structures will ultimately lead to the development of nanoscale logic components that exhibit quantum effects, and must therefore be addressed according to quantum-computing principles.

Different types of quantum computers base their operation on different quantum-mechanical phenomena. A 'topological' quantum computer is a quantum computer whose operation is based on a non-Abelian topological phase of matter that may support 'braidable' quasiparticles. This type of quantum computer is expected to be less prone to the issue of quantum decoherence than other types of quantum computers, and may therefore serve as a relatively fault-tolerant quantum-computing platform.

SUMMARY

One aspect of this disclosure relates to a method to evaluate a semiconductor-superconductor heterojunction for use in a qubit register of a topological quantum computer. The method comprises (a) measuring one or both of a radio-frequency (RF) junction admittance of the semiconductor-superconductor heterojunction and a sub-RF conductance including a non-local conductance of the semiconductor-superconductor heterojunction, to obtain mapping data and refinement data; (b) finding by analysis of the mapping data one or more regions of a parameter space consistent with an unbroken topological phase of the semiconductor-superconductor heterojunction; and (c) finding by analysis of the refinement data a boundary of the unbroken topological phase in the parameter space and a topological gap of the semiconductor-superconductor heterojunction for at least one of the one or more regions of the parameter space.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

DETAILED DESCRIPTION

Quantum Computer Architecture

Figure 1:
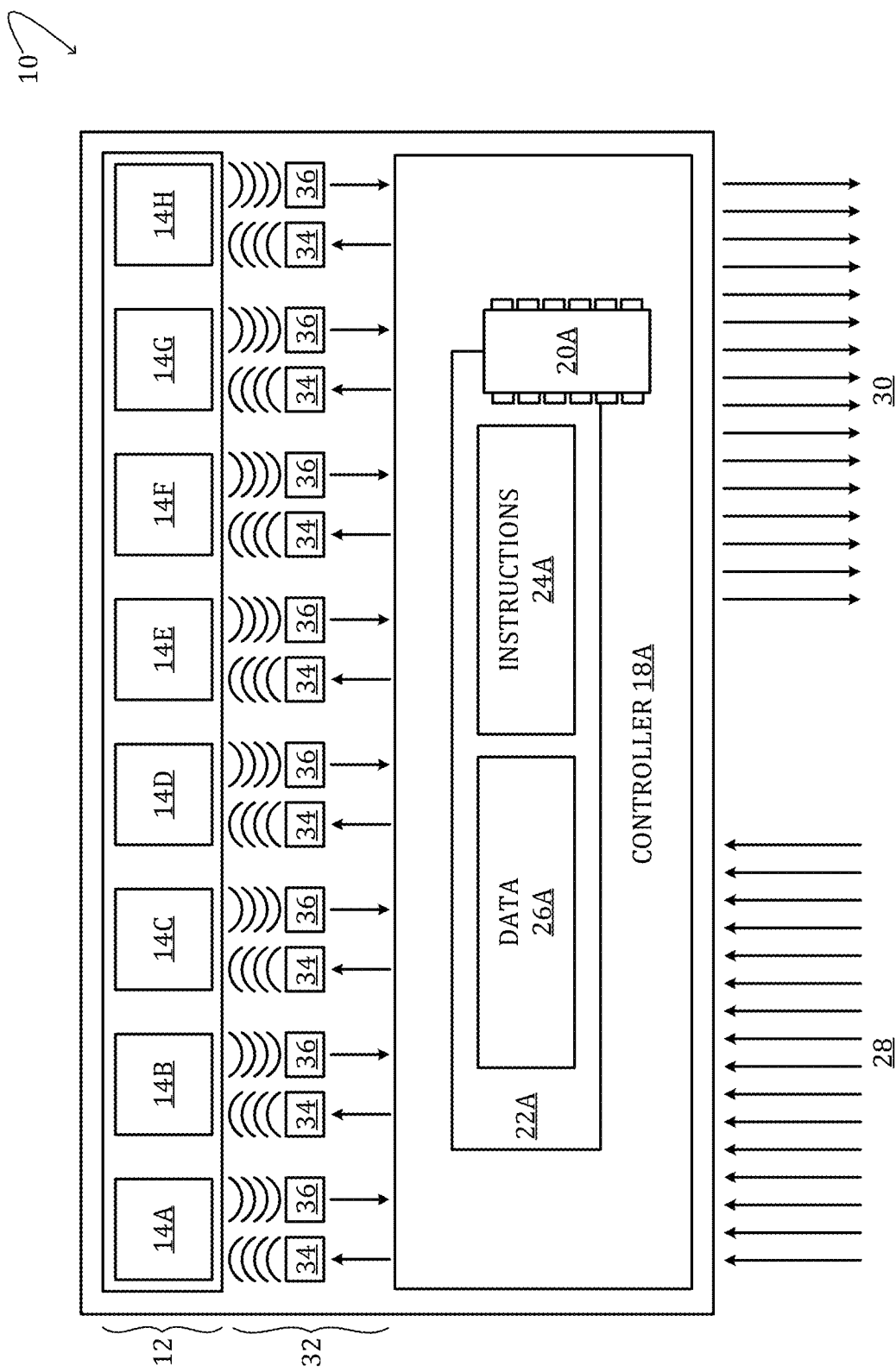
FIG. 1 shows aspects of an example quantum computer.

FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes at least one qubit register 12 comprising an array of qubits 14. The illustrated qubit register is eight qubits in length; qubit registers comprising longer and shorter qubit arrays are also envisaged, as are quantum computers comprising two or more qubit registers of any length.

Qubits 14 of qubit register 12 may take various forms, depending on the desired architecture of quantum computer 10. While this disclosure relates to qubits embodied as quasiparticles in a non-Abelian topological phase, a qubit alternatively may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. More generally, each qubit 14 may comprise any particle or system of particles that can exist in two or more discrete quantum states that can be measured and manipulated experimentally. For instance, a qubit may be implemented in the plural processing states corresponding to different modes of light propagation through linear optical elements (e.g., mirrors, beam splitters and phase shifters), as well as in states accumulated within a Bose-Einstein condensate.

Figure 2:
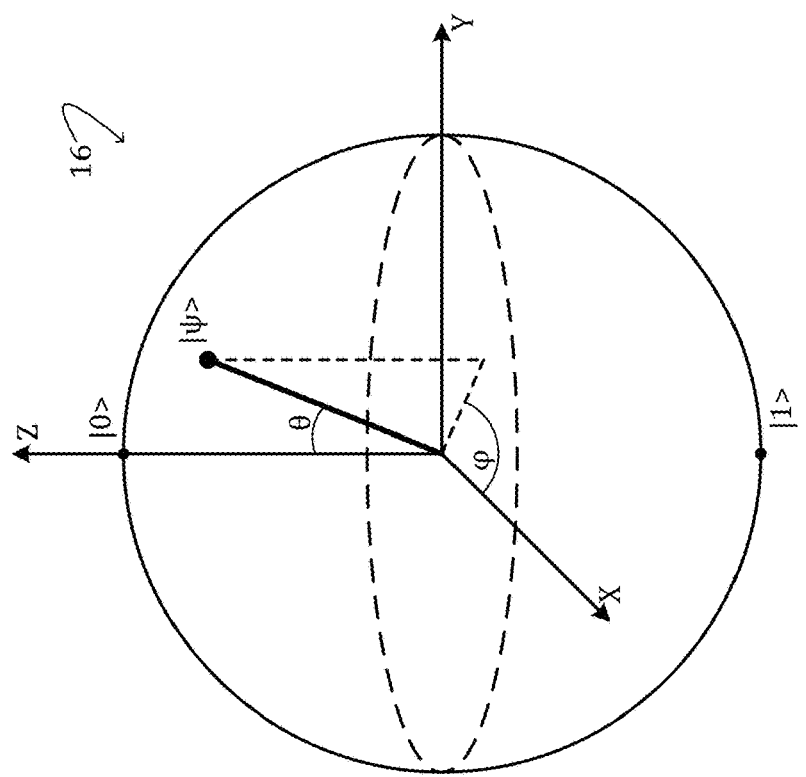
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors $|0\rangle$ and $|1\rangle$, respectively. The set of points on the surface of the Bloch sphere comprise all possible pure states $|\psi\rangle$ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18A. The controller includes at least one processor 20A and associated computer memory 22A. A processor 20A of controller 18A may be coupled operatively to peripheral componentry, such as network componentry, to enable the quantum computer to be operated remotely. A processor 20A of controller 18A may take the form of a central processing unit (CPU), a graphics processing unit (GPU), or the like. As such, the controller may comprise classical electronic componentry. The terms 'classical' and 'non-quantum' are applied herein to any component that can be modeled accurately as an ensemble of particles without considering the quantum state of any individual particle. Classical electronic components include integrated, micro-lithographed transistors, resistors, and capacitors, for example. Computer memory 22A may be configured to hold program instructions 24A that cause processor 20A to execute any function or process of the controller. The computer memory may also be configured to hold additional data 26A. In examples in which qubit register 12 is a low-temperature or cryogenic device, controller 18A may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18A of quantum computer 10 is configured to receive a plurality of inputs 28 and to provide a plurality of outputs 30. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18A is operatively coupled to qubit register 12 via quantum interface 32. The quantum interface is configured to exchange data bidirectionally with the controller. The quantum interface is further configured to exchange signal corresponding to the data bidirectionally with the qubit register. Depending on the architecture of quantum computer 10, such signal may include electrical, magnetic, and/or optical signal. Via signal conveyed through the quantum interface, the controller may interrogate and otherwise influence the quantum state held in the qubit register, as defined by the collective quantum state of the array of qubits 14. To this end, the quantum interface includes at least one modulator 34 and at least one demodulator 36, each coupled operatively to one or more qubits of the qubit register. Each modulator is configured to output a signal to the qubit register based on modulation data received from the controller. Each demodulator is configured to sense a signal from the qubit register and to output data to the controller based on the signal. The data received from the demodulator may, in some examples, be an estimate of an observable to the measurement of the quantum state held in the qubit register.

In some examples, suitably configured signal from modulator 34 may interact physically with one or more qubits 14 of qubit register 12 to trigger measurement of the quantum state held in one or more qubits. Demodulator 36 may then sense a resulting signal released by the one or more qubits pursuant to the measurement, and may furnish the data corresponding to the resulting signal to controller 18A. Stated another way, the demodulator may be configured to output, based on the signal received, an estimate of one or more observables reflecting the quantum state of one or more qubits of the qubit register, and to furnish the estimate to the controller. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18A, quantum interface 32 may be configured to implement one or more quantum-logic gates to operate on the quantum state held in qubit register 12. Whereas the function of each type of logic gate of a classical computer system is described according to a corresponding truth table, the function of each type of quantum gate is described by a corresponding operator matrix. The operator matrix operates on (i.e., multiplies) the complex vector representing the qubit register state and effects a specified rotation of that vector in Hilbert space.

For example, the Hadamard gate HAD is defined by $$HAD = \frac{1}{\sqrt{2}}\begin{bmatrix} 1 & 1 \\ 1 & -1 \end{bmatrix}. \quad (1)$$

The HAD gate acts on a single qubit; it maps the basis state $|0\rangle$ to $(|0\rangle+|1\rangle)/\sqrt{2}$, and maps $|1\rangle$ to $(|0\rangle-|1\rangle)/\sqrt{2}$. Accordingly, the HAD gate creates a superposition of states that, when measured, have equal probability of revealing $|0\rangle$ or $|1\rangle$.

The phase gate S is defined by $$S = \begin{bmatrix} 1 & 0 \\ 0 & e^{i\pi/2} \end{bmatrix}. \quad (2)$$

The S gate leaves the basis state $|0\rangle$ unchanged but maps $|1\rangle$ to $e^{i\pi/2}|1\rangle$. Accordingly, the probability of measuring either $|0\rangle$ or $|1\rangle$ is unchanged by this gate, but the phase of the quantum state of the qubit is shifted. This is equivalent to rotating $\psi$ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{bmatrix} 1 & 0 & 0 & 0 \\ 0 & 0 & 1 & 0 \\ 0 & 1 & 0 & 0 \\ 0 & 0 & 0 & 1 \end{bmatrix}. \quad (3)$$

The foregoing list of quantum gates and associated operator matrices is non-exhaustive, but is provided for ease of illustration. Other quantum gates include Pauli-X, -Y, and -Z gates, the $\sqrt{NOT}$ gate, additional phase-shift gates, the $\sqrt{SWAP}$ gate, controlled cX, cY, and cZ gates, and the Toffoli, Fredkin, Ising, and Deutsch gates, as non-limiting examples.

Figure 3:
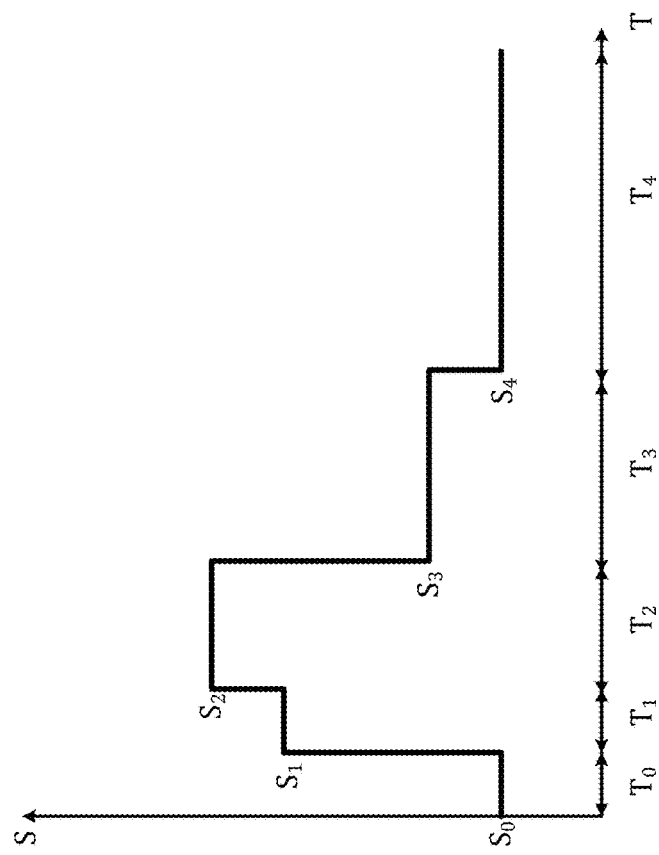
FIG. 3 shows aspects of an example signal waveform for effecting a quantum-gate operation in a quantum computer.

Continuing in FIG. 1, suitably configured signal from modulators 34 of quantum interface 32 may interact physically with one or more qubits 14 of qubit register 12 so as to assert any desired quantum-gate operation. As noted above, the desired quantum-gate operations are specifically defined rotations of a complex vector representing the qubit register state. In order to effect a desired rotation O, one or more modulators of quantum interface 32 may apply a predetermined signal level $S_i$ for a predetermined duration $T_i$. In some examples, plural signal levels may be applied for plural sequenced or otherwise associated durations, as shown in FIG. 3, to assert a quantum-gate operation on one or more qubits of the qubit register. In general, each signal level $S_i$ and each duration $T_i$ is a control parameter adjustable by appropriate programming of controller 18A.

The term 'oracle' is used herein to describe a predetermined sequence of elementary quantum-gate and/or measurement operations executable by quantum computer 10. An oracle may be used to transform the quantum state of qubit register 12 to effect a classical or non-elementary quantum-gate operation or to apply a density operator, for example. In some examples, an oracle may be used to enact a predefined 'black-box' operation f(x), which may be incorporated in a complex sequence of operations. To ensure adjoint operation, an oracle mapping n input qubits $|x\rangle$ to m output or ancilla qubits $|y\rangle=f(x)$ may be defined as a quantum gate $O(|x\rangle \otimes |y\rangle)$ operating on the n+m qubits. In this case, O may be configured to pass the n input qubits unchanged but combine the result of the operation f(x) with the ancillary qubits via an XOR operation, such that $O(|x\rangle \otimes |y\rangle)=|x\rangle \otimes |y+f(x)\rangle$. As described further below, a state-preparation oracle is an oracle configured to generate a quantum state of specified qubit length.

Implicit in the description herein is that each qubit 14 of qubit register 12 may be interrogated via quantum interface 32 so as to reveal with confidence the standard basis vector $|0\rangle$ or $|1\rangle$ that characterizes the quantum state of that qubit. In some implementations, however, measurement of the quantum state of a physical qubit may be subject to error. Accordingly, any qubit 14 may be implemented as a logical qubit, which includes a grouping of physical qubits measured according to an error-correcting oracle that reveals the quantum state of the logical qubit with confidence.

Topological Quantum Computer

In a topological quantum computer, the quantum state held in each qubit is a state of two or more braidable quasiparticles, or 'anyons', observed within a non-Abelian topological phase of matter. The world lines of different anyons are quantum mechanically forbidden from intersecting or merging. This feature forces their paths to form stable braids that pass around each other in space-time. Relative to trapped particles used in other types of quantum computers, anyon braids are more resistant to quantum decoherence, which is a source of error in quantum computation. However, the realization of a topological quantum computer requires the ability to engineer a suitable topological phase and to manipulate the anyons therein.

Early experiments in topological quantum computing focused on the two-dimensional 'electron gas' of a supercooled, thin layer of gallium arsenide (GaAs) sandwiched between layers of aluminum gallium arsenide (AlGaAs) and manipulated in a strong magnetic field. Implementation of a quantum computer using that architecture would require the braiding of individual quasiparticle excitations combined with anyonic interferometry-based measurement, involving coherent quasiparticle transport over significant distances.

Proposed more recently is a one-dimensional topological qubit architecture that appears to be more amenable to practical implementation. The proposed system uses a semiconductor-superconductor heterostructure wherein superconductivity, strong spin-orbit coupling, and magnetic fields cooperate to form a topological, superconducting state that supports Majorana zero modes (MZMs). This new architecture obviates the need to move quasiparticles by employing a 'measurement-only' method wherein a sequence of measurements has the same effect as a braiding operation. This architecture does not require quasiparticles to be moved through an interferometry loop, but rather exploits a distinction between a 'fermion parity-protected topological phase' (the actual genus of the proposed heterostructure) and a true topological phase. Advantageously, topological charge in a fermion parity-protected topological phase can be manipulated by the process of electron tunneling into a MZM. Transport through a pair of MZMs can provide a measurement of their combined topological charge in the presence of a large charging energy.

In view of these and other useful properties, MZMs may be used as a basis for the qubits of a topological quantum computer. The MZMs are created at the ends of semiconductor-superconductor heterostructures tuned into a topological regime by the appropriate magnetic field and gate voltages. A series of practical implementations are described in Karzig et al., *Scalable Designs for Quasiparticle-Poisoning-Protected Topological Quantum Computation with Majorana Zero Modes*, arXiv:1610.05289v4 [cond-mat.mes-hall] 21 Jun. 2017. Suitable heterostructure materials and material properties are described in Lutchyn et al., *Majorana Fermions and a Topological Phase Transition in Semiconductor-Superconductor Heterostructures*, arXiv: 1002.4033v2 [cond-mat.supr-con] 13 Aug. 2010. The entirety of both of the above references is hereby incorporated by reference herein, for all purposes.

Example implementations include at least two topological superconducting segments in a qubit, totaling at least four Majorana zero modes per qubit. The states used for quantum computation will be the degenerate ground states of the qubit, in contrast to non-degenerate quantum-computing architectures where the two states of the qubit have different energies. The degeneracy of the qubit states and the spatial separation of the *Majorana* zero modes ensure long coherence times and feasibility of precise application of a set of Clifford gates.

Figure 4:
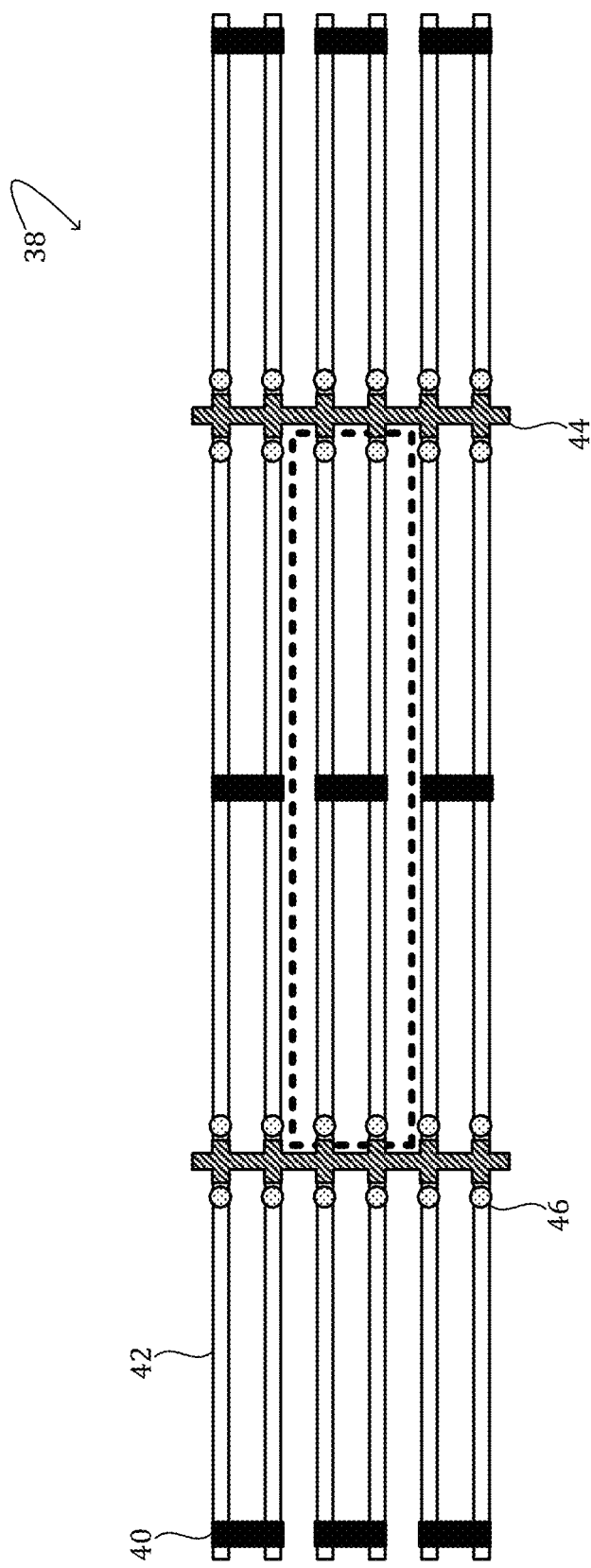
FIG. 4 shows aspects of an example qubit architecture comprising a linear tetron array.

FIG. 4 illustrates an example of a topological qubit architecture comprising a linear tetron array 38. The linear tetron array includes segments 40 and 42 comprising a classical superconductor, such as aluminum (Al), segments 44 comprising a semiconductor, such as indium arsenide (InAs) or indium antimonide (InSb), and a plurality of MZMs 46. The length $\ell_c$ of the non-topological segments is much larger than the corresponding coherence length $\xi_c$ of the non-topological regions, and the length $l_t$ of the topological segments is much larger than the coherence length $\xi$ of the topological regions. The dashed box in FIG. 4 represents a single qubit in the form of a linear tetron. Additional topological superconducting links and semiconducting structures allow appropriate measurements to manipulate and entangle the linear tetrons.

Qubit structures as shown in FIG. 4 are difficult to fabricate with the degree of reproducibility required for practical quantum computing. Due to material or fabrication defects, some candidate structures may fail to operate in the desired topologic regime. Even for candidate structures that do operate in the desired topologic regime, the appropriate terminal-bias and magnetic-field levels required for qubit operation cannot always be predicted a priori. Accordingly, candidate semiconductor-superconductor heterojunctions must be 'pre-screened' for appropriate topologic behavior, and successful heterojunctions must be 'tuned' to discover the appropriate operating parameters, before being incorporated into a qubit register.

Method Overview

This disclosure provides a method for pre-screening and tuning a candidate semiconductor-superconductor heterojunction for a topological qubit. The method includes a procedure for extracting the 'topological gap' of the candidate heterojunction (vide infra) using at least two stages of measurement followed by analysis. The measurement is enacted on a device having three current-carrying contacts, one of which is superconducting (a 'three-terminal device' herein). The 'mapping' phase of this method includes a fast measurement that roughly identifies promising regions. The subsequent 'refinement' phase includes a slower measurement performed on each of the promising regions identified in the mapping phase. In some examples, the method uses density-based clustering algorithms on two-sided zero-bias peak (ZBP) data to extract predicted topological regions and classification of bias traces using peak finding or machine learning. It improves the accuracy of previous methods by checking the stability of the ZBP to variations in cutter gate voltage and by checking for gap closing at the boundary of the suspected topological region. Meta-analysis of the ZBP data is used to extract the probability of finding a topological region across many devices of the same preparation. This feature can be used for characterizing the growth and/or fabrication method for topological qubit structures.

As used herein, a 'false positive' identifies a trivial system as topological, whereas a 'false negative' identifies a topological system as trivial. The technique herein improves over the basic ZBP search by including a separate ZBP search on both sides of the three-terminal device, thereby reducing the probability of false positives. It also includes non-local measurements to extract the energy gap in the candidate system, providing additional information for detection of a topological gap. Lastly, it includes non-discriminant measurement within regions of the parameter space that have pre-defined boundaries, thereby excluding false-positives deriving from confirmation and selection biases (which could occur if the measurement region were human-selected).

Figure 5:
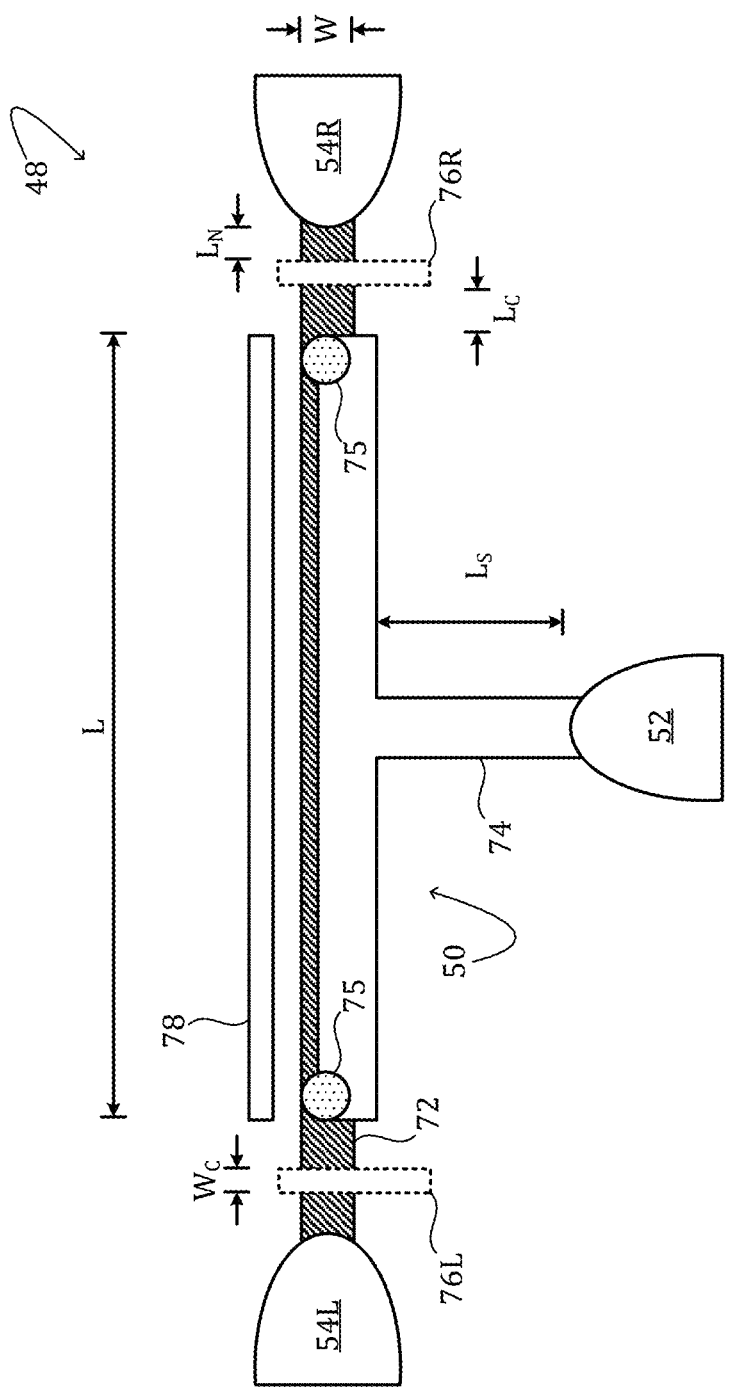
FIG. 5 shows aspects of an example semiconductor-superconductor heterojunction device evaluated according to the methods herein.

FIG. 5 shows aspects of an example semiconductor-superconductor heterojunction device 48 evaluated according to the methods herein. Generally speaking, a semiconductor-superconductor heterojunction suitable for testing comprises at least three terminals supporting electronic admittance and conductance measurements, in addition to a plurality of electrostatic control terminals. Device 48 of FIG. 5 is a three-terminal device comprising a topological middle segment 50 coupled to ground probe 52 through a trivial superconductor, and two normal probes, 54R and 54L coupled to the two ends of a semiconductor wire. This geometry allows simultaneous measurement of the tunneling signatures of the topological phase at the two ends of middle segment 50, for correlation to the zero-bias features on the two sides. Further, the non-local signal between the two normal probes provides information about the lowest energy of the extended states of the topological segment, which may be used as a proxy for the topological gap (e.g., in a sufficiently long semiconductor wire, the non-local signal sets in at bias values corresponding to the lowest energy extended mode in the wire.). Accordingly, the method herein does not directly measure the topological character of a system but instead measures a set of surrogate variables, which, from analytical calculations and numerical simulations, are known to correlate well to the topological invariant. The surrogate criteria for identifying a topologically non-trivial region are as follows:
 1. Correlated zero-bias differential conductance peaks occur on both sides of the device throughout a topological region with well-separated Majoranas.
 2. For low values of the magnetic field, the bulk of the system is gapped. As the magnetic field is increased, the bulk gap should close and reopen in the topological region. The value of the energy gap in the bulk of the wire can be detected in a three-terminal device via a non-local conductance measurement.

Within a region in parameter space that fulfills the criteria for being topological, the magnitude of the bulk gap varies. The operational meaning of the term 'topological gap' in the context of this disclosure is the magnitude of the maximum bulk gap in such a topological region.

To be able to distinguish between topological and non-topological systems, the method must correctly identify topological regions in idealized numerical test data sets. Accordingly, the methods herein show high overlap between the topologically identified region and the numerically determined topological index (as demonstrated in FIG. 10, for example). Further, the method must correctly label currently known candidates for false positive signatures as non-topological. These include:

1. Trivial local bound states induced by cutters, impurities or smooth potentials (e.g., pairs of quasi-Majorana modes at the ends of the device), which are examples of non-topological zero-bias peaks;
2. Disorder-induced low energy subgap states (non-topological zero-bias peaks and possible accidental gap-closing/reopening features);
3. Trivial gap closing without proper reopening in finite-size systems (e.g., a Coulomb-blockaded system) where a finite-size gap closes at small fields and gives rise to oscillations of low-energy states (false gap closing/reopening feature); and
4. Trivial accidental closing-like features caused by a set of discrete states crossing zero energy (false gap-closing/reopening feature).

The way that the method reduces such false positives is by using data collected over a large range of parameter values. Accidental or fine-tuned points should not persist under change of parameter values, as a topological phase does. Moreover, the method correlates different indicators of the topological phase, as both of the above criteria are to be verified—viz., zero-bias conductance peaks have to be present simultaneously at both ends, and the system needs to show a gap closing and reopening feature in the non-local conductance. Given those criteria, the above false positives can be correctly identified, since:

1. False positives 1 and 2 in the enumeration above lack a gap-closing/reopening feature in the non-local conductance; and
2. False positives 3 and 4 lack correlated and stable zero-bias peaks at both ends of the semiconductor wire.

Simultaneous occurrence of different types of false positives is not expected to be stable to variations across the parameter space.

A remaining concern of the method is to prevent false negatives, which are addressed further below. In particular, a specifically constructed example combining features 1 and 4 with false-positive regions is addressed, along with an example relating to a strongly disordered system. While disorder can lead to zero-bias peaks, it will in general not lead to extended regions of correlated ZBPs. Similar stability requirements rule out the potential false positive 3 in the above enumeration.

The method is guided by the following principles:

1. The method must guarantee that both criteria enumerated above can be verified.
2. Measuring as wide a range as possible of the parameter space of the device is required because:
   a. The initial uncertainty over the presence and position of the topological phases can be high.
   b. Checking the stability of zero-bias peaks in parameter space helps to rule out possible false positives.
   c. It reduces unwanted selection bias.
3. The method should be completed in a reasonable amount of time (days at most), and require minimal human decision making during its implementation.
4. Bias-dependent non-local conductance measurements in DC are currently slow. Accordingly, they may be replaced either with non-local RF measurements or with non-local DC measurements at or close to zero bias, to determine the presence of the gap.
5. For a given execution of the method, the sequence of measurements should be pre-determined and have a finite length, in order to prevent open-ended searches which, especially given the large parameter space, can take a long time and may introduce selection bias. It is still possible to allow for the measurement sequence to be improved over time, for instance, by applying lessons learned in previous runs.
6. For a given execution of the method, the data analysis procedure should be determined before the data is collected and inspected, and should have pre-determined outputs, in order to avoid over-fitting and confirmation bias, and to guarantee that the method has an outcome. Again, it is still possible to allow for the data analysis code to improve over time, for instance, by using improved algorithms and applying lessons learned in previous runs.

Figure 6:
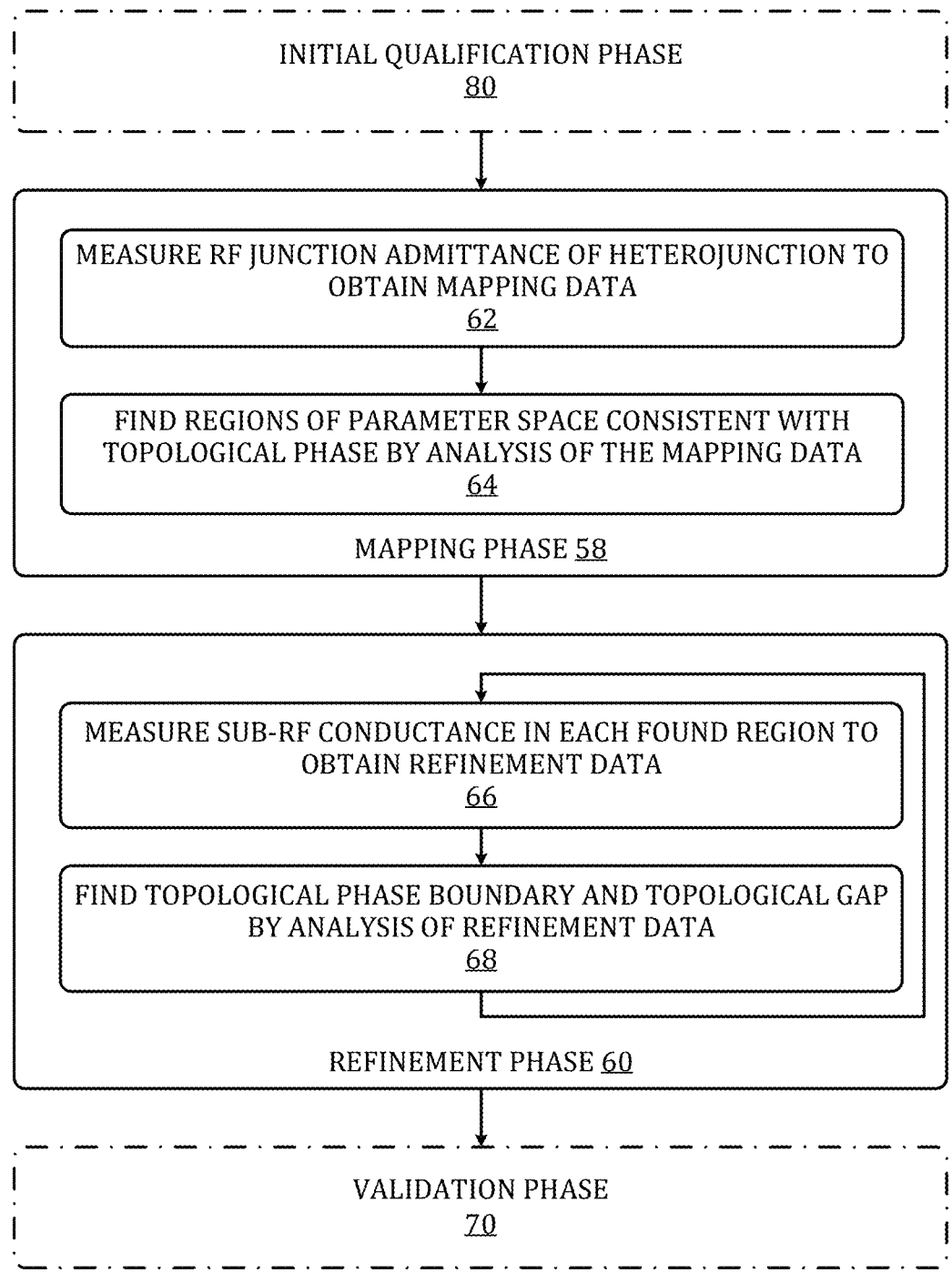
FIG. 6 shows aspects of an example method to evaluate a semiconductor-superconductor heterojunction for use in a qubit register of a topological quantum computer.

In view of the above considerations, FIG. 6 shows aspects of an example method 56 to evaluate a semiconductor-superconductor heterojunction for use in a qubit register of a topological quantum computer. Method 56 includes a mapping phase 58 and a refinement phase 60. In some examples, the mapping and refinement phases may be enacted separately—e.g., to evaluate a new experimental setup or a change in implementation.

Mapping phase 58 and refinement phase 60 each include measurement followed by analysis. The mapping phase includes fast RF measurement 62 of normal-superconductor (NS) junction admittances to provide mapping data. In other examples, the measurement may be a DC measurement. Measured quantities include the local conductance at each end of the semiconductor wire over a wide parameter space in bias, field, plunger and left/right cutter gate voltages. In some examples the mapping data may include the non-local conductance data as well. In some examples, the 'mapping data' from measurement 62 includes two 5D datasets of RF signal versus field, left cutter, right cutter, plunger, and left or right bias. The associated data analysis 64 then looks for extended regions in the parameter space where correlated ZBPs are present. In some examples, the output of analysis 64 includes a list of 'promising' regions in 4D parameter space (field, left cutter, right cutter, plunger), ranked by the likelihood that there is an unbroken topological phase with a finite topological gap within that region.

Each promising region identified in this manner is then further investigated, iteratively, in refinement phase 60. The refinement phase includes a slower sub-RF measurement 66 of the full conductance matrix within each promising region, using lock-in amplifiers and including local and non-local conductance. In other examples the more detailed measurement can be an RF measurement. In some examples, the 'refinement data' from measurement 66 includes the full conductance matrix for each promising region as a function of bias. Associated data analysis 68 on the full conductance matrix, and in particular of the non-local conductance, yields information about the behavior of the bulk gap for identifying a region as topological according to the above criteria. It also allows quantitative assessment of the magnitude of the gap within each topological region. In some examples, analysis 68 includes determination of the boundary of the topological phase within each measured region (or the absence of a topological phase) based on joint analysis of local and non-local conductance. Further, the value of the topological gap (if any) is determined for each region. In refinement phase 60, measurements over the promising regions may be repeated with adjusted ranges and resolution—e.g., not indefinitely but only under appropriate circumstances. Accordingly, refinement phase 60 may include a heavily regulated feedback loop that adjusts the bias range and/or resolution in parameter space. The feedback loop may include a maximum of two iterations, for example.

On completion of refinement phase 60, a region having optimal properties of topological phase is identified. The region may be defined, for instance, by a combination of a large gap and high confidence of topological character. To further increase the confidence, an additional validation phase 70 may be enacted optionally, where the stability of the optimal region is put to additional testing. In some examples, validation phase 70 includes validating a ZBP in regions identified in refinement phase 60, by checking the stability of the ZBP to variations in cutter-gate voltage. Such variations may be of any desirable magnitude, including large variations. Furthermore, in examples in which the semiconductor-superconductor heterojunction is one of a series of analogously prepared semiconductor-superconductor heterojunctions, the validation phase may include meta-analysis of ZBP data across the series. The meta-analysis may be conducted in order to compute a probability of finding a topological region in other, analogously prepared semiconductor-superconductor heterojunctions.

As noted previously, the measurements in method 56 are made on three-terminal devices, as shown in FIG. 5. Some constraints on the device to be measured will now be discussed, with continued reference to that drawing. Device 48 of FIG. 5 includes a semiconductor wire 72, which is typically a nanowire, including, in some examples, a gated region of a two-dimensional semiconductor. In some implementations, the semiconductor wire may comprise a selective-area grown (SAG) nanowire. In device 48, semiconductor nanowire 72 is proximitized by superconductor 74. The superconductor extends to the side, away from the hybrid wire. FIG. 5 shows representative locations of MZMs 75 in the scenario in which device 48 is operating in a topological regime. The 'T' shape of the superconductor is not necessarily required, and the width of the vertical superconducting section can extend over the entire length L of the device. The normal contacts 54R and 54L contact the semiconductor wire on each end of the device. Contact 52 is coupled to superconductor 74, making a device with three terminals, suitable for electrical transport measurements. The entire device is covered in a dielectric layer (not shown in the drawing). Electrostatic cutter gates 76R and 76L are used to form tunnel barriers at each end of semiconductor wire 72. Electrostatic plunger gate 78 tunes the chemical potential inside the device.

In the illustrated example, important dimensions include:
L: the maximal length of the topological region,
$L_S$: the length of the superconducting segment connecting the topological region to the lead grounding superconductor 74,
W: the width W of semiconductor wire 72 (or more generally the cross section),
$L_C$: the distance between the cutter gates 76 and superconductor 74,
$W_C$: the width of each cutter gate 76,
$L_N$: the spacing between each cutter gate 76 and the associated normal lead 54.

The distance of plunger gate 78 from semiconductor wire 72 can be important for the lever arm and the potential profile within the semiconductor wire, also depending on the dielectric material used. Another variable is the geometry of plunger gate 78 with respect to the semiconductor wire (wrap gate versus side gate). If the plunger gate wraps around the semiconductor (wrap gate), then the lever arm will be larger, which allows the chemical potential inside the semiconductor wire to be changed by a larger amount. In turn, if the coupling of the plunger gate to the semiconductor wire is too strong, a small voltage noise on the plunger gate will have a larger effect, potentially artificially broadening the chemical potential inside semiconductor wire 72.

One of the most important parameters is the length L of the proximitized semiconductor wire. Here, two effects are competing against each other. On the one hand, the semiconductor wire needs to have a sufficient length to avoid finite-size effects and make the signatures of the topological phase transition and correlated ZBPs clear. On the other hand, longer wires will increase the practical difficulty of growing or fabricating a working device and may reduce the non-local signal. In particular, it will be more difficult to ensure sufficient homogeneity in the semiconductor wire and the absence of strong defects (like a bad contact to the superconductor suppressing the proximity effect) when the semiconductor wire length is increased. Little data is currently available for devices longer than 2 μm. From a theoretical point of view, $5\xi$, where $\xi$ is the topological coherence length, presents a minimal length scale where the finite-size effects are sufficiently suppressed. Even in clean wires the non-local signal will be suppressed with increasing length of the semiconductor wire. The issues above will lead to a device-quality dependent upper bound on L for a successful extraction of non-local information.

The length $L_S$ is chosen such that leakage of quasiparticles to the center lead is suppressed. A working estimate is $L_S > 10\xi_S$, where $\xi_S$ is the coherence length of superconductor 74 ($\xi_S = 200$ nm for disordered Al). In typical experiments $L_S$ can be up to the scale of millimeters, thus exceeding the minimum by several orders of magnitude.

Experimental evidence indicates that the distance $L_C$ to cutter gate 76 must be well below 100 nm to avoid spurious end states and enable high-resolution tunneling spectroscopy. An optimal choice for $L_C$ and the design of the cutter gate may be determined by combining simulations from electrostatics, realistic transport, and fabrication capabilities. As a place holder, the requirement $L_C < 40$ nm may be used. It should be noted that the cutter design may be varied in terms of width of the cutter We and distance between the cutter and the normal lead. For InSb wires, a reduced spacing between the cutter and the normal lead may be desired, since these wires are normally-off and the cutter has to open up this segment of the wire too.

Note that the parameter of wire width W is not necessarily important for the viability of the disclosed method but will influence the likelihood of getting a positive result from the method. For example, the width controls the number of channels, and numerical simulations show that fewer channels are beneficial to reach the topological phase.

Table 1 summarizes current estimates for the various requirements on device geometry in terms of the materials currently used, giving estimated material-specific requirements for device dimensions. For these values, the following estimates for the coherence length at the point of the maximal gap were used: $\xi(InSb/Al)=400$ nm, $\xi(InAs/Al)=300$ nm and $\xi_S=200$ nm.

| Quantity | InSb/Al | InAs/Al |
|---|---|---|
| L | >2.0 μm | >1.5 μm |
| $L_S$ | >2 μm | >2 μm |
| $L_C$ | <40 nm | <40 nm |

An appropriate choice of materials is necessary to obtain a system with a sufficiently large topological gap. Method 56 is agnostic, however, to the semiconductor-wire material. While the material stack is still under investigation (both theoretically and experimentally), current results indicate that InAs with a barrier material and InSb without a barrier are promising choices for obtaining a topological gap within a suitable range of energy. In some examples, a topological gap within a range of 25 to 200 μeV may be suitable to support the operation of a topological quantum computer. Narrower and broader ranges are also envisaged.

The current choice of superconductor is aluminum since it creates a hard induced gap in heterostructures with no subgap states at zero field. Again, the method is in large part agnostic to the choice of superconductor, as long as measurement parameters are adapted accordingly, for example, by extending the bias scan range for larger-gap superconductors or adjusting the dimensions of the device based on the values shown in Table 1.

The choice of the dielectric is very much dependent on the material stack used. The hybrid system places limits on the temperature that a given material stack can be exposed to. The maximal gate voltage that can be applied to the electrostatic gates before the dielectric breaks down (breakdown voltage $V_{break}$) is an important material quantity, which preferably is known for a given dielectric layer and SAG material system, as it sets fundamental limits on device operation. Breakdown voltages can either be measured on a test device or determined by standard electrical characterization (SEC) measurements. If experimentally feasible, one recommendation is to fabricate, nearby on the same chip, an identical device to the device under test, to allow for a measurement of a realistic $V_{break}$.

Returning now to FIG. 6, before a device is subjected to detailed measurement, the device may be qualified in order to determine that it meets a set of criteria. Accordingly, method 56 includes an initial qualification phase 80. The initial qualification phase may include preliminary assessment of conductance, tunnel spectroscopy, and time stability, as described below.

With regard to device conductance, the device is considered conducting if the resistance through the device is <25 kΩ, between all three terminals, measured at high bias voltage $V_{bias,high}$>2Δ, where Δ is the superconducting gap. For InSb-based devices, this may require initially opening the channel by applying positive voltages to the cutter gates. With regard to gate pinch-off, all gate resistances should be >500 MΩ to ground. All gates used to form a tunnel barrier (cutters) have to pinch off the device individually. To test the gate pinch-off, conductance between the superconducting terminal and the corresponding normal terminal is measured as a function of cutter gate voltage at high bias. The device is considered pinched off when a conductance <0.005 $e^2/h$ is reached. The plunger gate, used to tune the chemical potential in the topological segment should be able to tune the conductance through the device, to some extent. The effect of the plunger gate can be most easily tested in the tunneling regime, using tunnel spectroscopy as described further below. Hysteresis on both cutter gates and plunger gates may be acceptable, since all measurements can be performed in the same sweep direction. However, it is required that after a hysteresis loop on either gate, states do not measurably shift in gate space, as detailed hereinafter.

With regard to tunnel spectroscopy, once the cutter gates have been tuned to a regime where the high-bias conductance is on the order of 0.1 $e^2/h$, conductance as a function of bias and a gate voltage (either plunger or tunnel gate) is measured at zero magnetic field. Peaks in the differential conductance versus bias should be clearly identifiable at a bias around the expected induced superconducting gap and should not change position for small gate voltage changes (given that the high-bias conductance does not change by a large amount). At zero field and at energies below the superconducting gap, the number of finite conductance features should be low, to reduce the probability of false positives. Ideally, the zero-field conductance traces should be devoid of discrete subgap state features. This can be quantified by requiring average subgap conductance to be below ¼ of the high-bias conductance.

With regard to time stability, in the tunneling regime the high-bias conductance should be stable. This means the conductance should not jump or drift by more than $\Delta g \sim 0.2$ $e^2/h$ on a timescale of t=10 minutes. With regard to RF response, the resonances used for the fast RF measurements should be identified for a specific device, for example, by comparing the resonances in the open versus the pinched-off regime. For all terminals where fast measurements are needed, a clear response of one resonance as a function of the corresponding tunnel gate should be visible. Effective impedance matching is necessary in order to obtain optimal sensitivity to changes in conductance. Based on typical device resistances of ≳100 kΩ and resonator inductance values on the order of 200 nH, the parasitic capacitance of the devices should be less than 1 pF to allow for high sensitivity.

Returning briefly to FIG. 6, measurement 62 of mapping phase 58 may include benchmarking of electrical noise and energy broadening. This step is valuable because energy broadening due to the measurement setup will provide a lower bound on the detectable topological gap. To ensure that broadening due to electrical noise is negligible, the integrated voltage noise RMS amplitude between 1 Hz and 500 Hz should be smaller than 3 μV.

Figure 7:
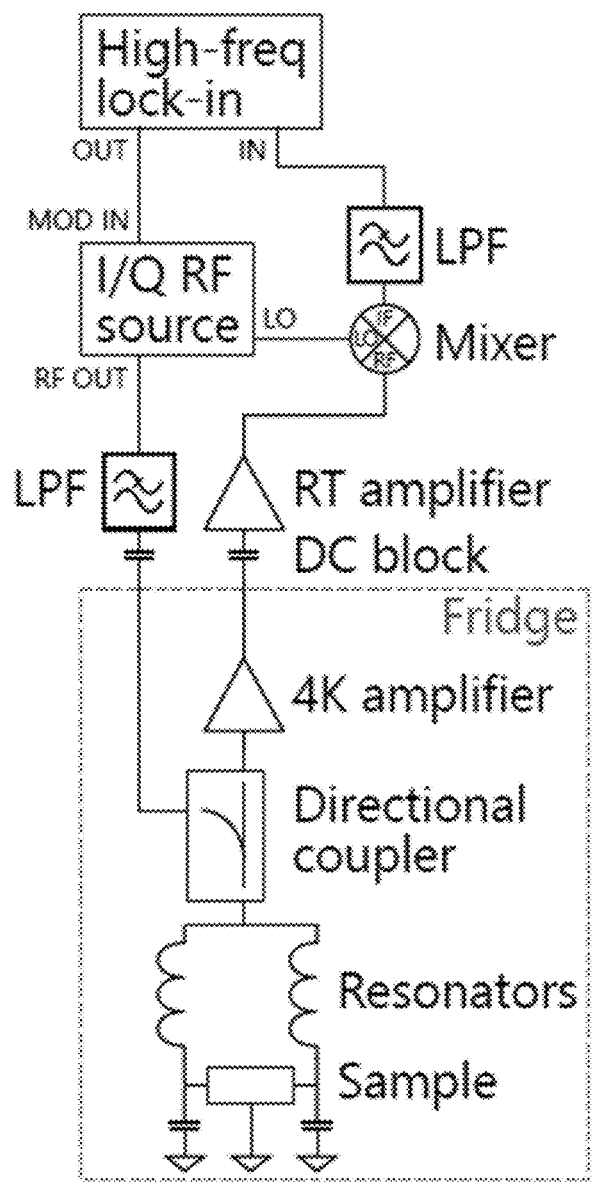
FIG. 7 shows aspects of an example radio-frequency (RF) reflectometry test circuit.

FIG. 7 shows aspects of an example measurement setup for RF reflectometry. In RF reflectometry measurements, the sample is bonded via a resonator to a transmission line. The sample resistance alters the impedance matching of the resonator to the transmission line, changing the reflection coefficient of RF signals sent into the line. Each of the two normal conducting leads of the device are bonded to a resonator for RF reflectometry measurements, which have resonant frequencies $f_{l,res}$ and $f_{r,res}$ for the left and right side, respectively. The frequency difference between these resonators on the left and the right sides should be greater than the line width of each resonator. The intermediate-frequency (IF) source generates RF pulses within the frequency bandwidth of the readout system. These pulses are up-converted to the frequency range of the resonators bonded to the device. For this, a mixer with high (>30 dB) carrier suppression mixes the IF signal with a local oscillator (LO) signal. The LO frequency must bridge the frequency difference between the bandwidth of the acquisition system $f_{ADC}$ and both resonator frequencies fires and $f_{l,res}$ and $f_{r,res}$.

If the RF source does not have separate I and Q outputs, one of the up-converted sidebands must be filtered away. This can be done by choosing $f_{LO}$>max $f_{l,res}$, $f_{r,res}$ and installing a low-pass filter with cutoff frequency=$f_{LO}$ between the up-conversion mixer and the input port of the fridge. After the signal gets reflected from the sample, it goes through a low-noise amplifier. Then it gets down-converted with a mixer using the original LO signal, low-pass filtered to the bandwidth of the acquisition system, and sent to the input of the acquisition system.

In order to measure local conductance with RF reflectometry, the reflected RF signal values must be calibrated against the directly measured differential conductance, for instance with lock-in amplifiers at low frequency. Since this is a sample-dependent procedure that can be performed in parallel with the actual measurement, it is described hereinafter, together with the measurement operations.

In order to benefit from fast acquisition rates, the gate and bias voltage scans on the device are triggered by hardware, to minimize the time spent on software communication (typically on the order of 10 ms). This can be done in a hardware-triggered two-dimensional scan synchronized with the acquisition system. One voltage is ramped with a saw-tooth function and sampled N times during each ramp, while a second voltage is at a slower rate during M cycles of the faster ramps, resulting in a N×M points scan. In order to be compatible with DC values of voltages applied on the contacts and gates, these voltage scans are applied on low-pass filtered DC lines. The fastest ramping rate must be below the cutoff frequency of the low-pass filters in the fridge lines, typically 1 kHz. In order to have a fast acquisition rate in sub-RF/DC measurement a narrow bias range near zero bias can be measured or the second and third harmonics of the signal can be measured using, e.g., a lock-in amplifier at a 2omega/3omega setting. In this way the bias scan is replaced with only targeted information about the presence of the zero-bias peaks and/or the gap in the bulk of the device.

Mapping Phase 58 in Detail

Figure 8:
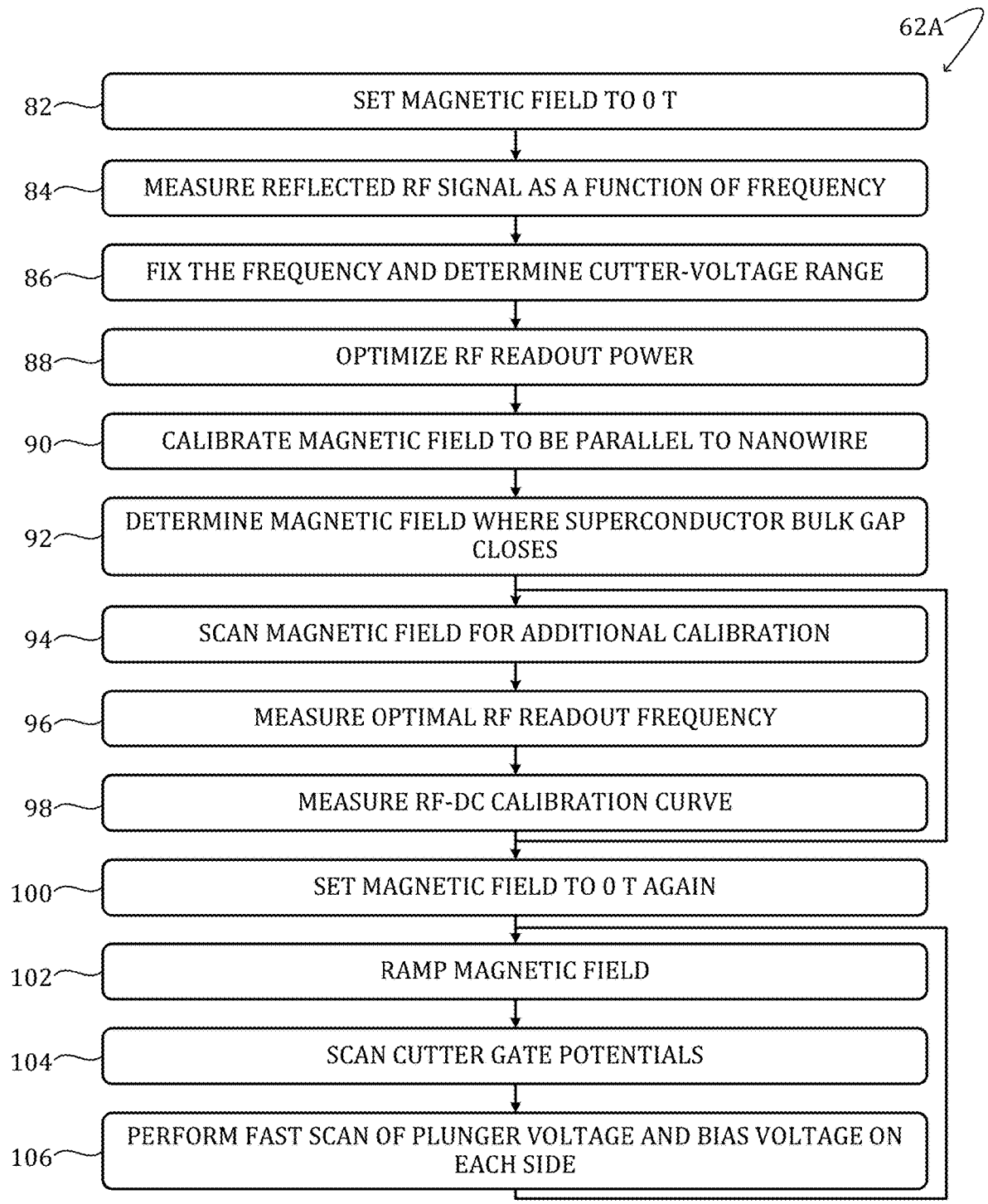
FIG. 8 shows aspects of an example method to measure the RF junction admittance of a semiconductor-superconductor heterojunction.

FIG. 8 shows additional aspects of measuring the radio-frequency (RF) junction admittance of the semiconductor-superconductor heterojunction to obtain mapping data. Method 62A of FIG. 8 illustrates fast measurement of local conductances by RF reflectometry, enacted in order to satisfy the first of the two topological gap criteria specified hereinabove, as it allows rapid characterization of a device and identification of candidates for topological regions based on correlations of ZBPs. The identification of these regions sets the stage for the non-local measurements of refinement phase 60. The fast local measurement for the three-terminal device is closely related to the fast measurement of a conventional NS junction.

At 82 of method 62A, the magnetic field is set to 0 T. At 84, for each side of the three-terminal device, the reflected RF signal is measured at a large bias voltage (for instance, 1 mV) as a function of frequency around the estimated resonance frequency (100 MHz to each side) and the corresponding cutter voltage from the open-channel setpoint (i.e., typically 0 V for InAs and 1 V for InSb) to 100 mV beyond full pinch-off voltage. The resonance frequency $f_{res}$ is identified as the frequency with the steepest change in signal as a function of cutter gate voltage, and the cutter voltage $V_{tunn,res}$ where the dip in the reflected signal as a function of frequency has the minimum absolute value.

At 86 the frequency is fixed at $f_{res}$, and the cutter voltage range, $V_{c,min}$ to $V_{c,max}$, that satisfies the following three conditions is determined:
 a. The range is hysteresis-free as measured by reproducibility of measurements after a hysteresis loop.
 b. The local conductance measured well above the superconducting gap (e.g., at 1 mV for Al) is between 0.05 $e^2/h$ and 0.2 $e^2/h$.
 c. The non-local conductance signal measured via standard low-frequency lock-in amplifier techniques is above the noise level.

For significant electrostatic cross-talk between plunger and cutter (geometry and material specific), this step may be repeated for different values of the plunger-gate voltage.

At 88 the RF readout power is optimized. In some examples, this action includes finding a region in cutter space that shows a clear gap with well-defined coherence peaks. To that end, the RF readout power on each side is scanned, measured at the sample (bottom of the fridge), from −80 dBm to −130 dBm in 1 dB steps. For each RF power, a fast scan of the bias voltage is made on the respective side from −1.5$\Delta_0$ to 1.5$\Delta_0$ $\Delta_0$ being the gap of the parent superconductor leading to a bias range −350 µV to 350 µV for Al), with a maximum step size of 5 µV and measure the reflected RF signal. For each side, the maximum RF power that does not broaden the features in the measurement is found, e.g., the coherence peaks, and set as the working RF power.

At 90 the magnetic field angle is calibrated so as to be parallel to the semiconductor wire. To this end, the magnetic field is set to a value at which the superconducting gap is not closed for a field parallel to the semiconductor wire, but is greatly reduced in size for a field perpendicular to the semiconductor wire, e.g., 500 mT for InAs and InSb SAG. The magnetic field angle is scanned around the expected value from the wire geometry, and for each value of the angle, the bias on one side of the device is scanned from −1.5$\Delta_0$ to +1.5$\Delta_0$ (−350 µV to +350 µV for Al) with a maximum step size of 5 µV. The reflected RF signal is then measured. The field angle is set to the one that yields the maximum gap size. Here the aim is for an alignment accuracy of better than 2° in both azimuthal and polar angles.

At 92 the maximum magnetic field $B_{max}$ where the superconductor bulk gap closes is determined. At 94 the magnetic field is scanned from 0 T to $B_{max}$ in steps of 100 mT to perform the RF-DC calibration. For each field value, the following additional calibration is performed.

At 96 the optimal RF readout frequency is measured. This can be done as a repetition of step 84. However, once the readout frequency has been identified, a quicker method can be followed. In one example, the cutter gate voltage is set to $V_{c,res}$ where the dip in the reflected RF signal as a function of frequency had the minimum absolute value at zero field. The RF reflected signal is measured as a function of RF frequency, from 50 MHz to each side of the resonance frequency found for the latest field value. The dip in magnitude of the RF signal closest to the previously found dip is found and set as the RF readout frequency. The result of this measurement may be saved to the database.

At 98 an RF-DC calibration curve is measured. On each side, the bias voltage is set to high bias (e.g., 1 mV for Al), to be above the superconducting gap. The respective cutter gate voltage is scanned from the open-channel setpoint (i.e., typically 0 V for InAs and 1 V for InSb) to 100 mV beyond pinch-off voltage. For each cutter voltage, the local conductance is measured with a lock-in amplifier on the respective side as well as the reflected RF signal. The result of this measurement is saved to the database to later establish the calibration function between reflected RF signal and conductance.

At 100 the magnetic field is set to 0 T again. At 102 the magnetic field is ramped from 0 T to $B_{max}$ in steps of $\Delta B$. The field step $\Delta B$ depends on the g factor and is such that states moving with field can be tracked. A reasonable range for InAs or InSb SAG is 10 mT≤$\Delta B$≤50 mT. For each value of the field, the following additional steps are performed.

At 104 the cutter gate potentials are scanned from $V_{c,min}$ to $V_{c,max}$ in $N_c$=15 steps on each side independently, to yield a total of $2N_c$ configurations. Such an independent scan is justified for local conductance measurements when the lever arm for cutter-plunger cross talk and the range of the cutter gate scan is small enough to not change the effective plunger voltage by more than the size of a plunger voltage step. For each cutter gate configuration, the following measurement is performed. The voltage limits $V_{c,min}$ and $V_{c,max}$ are as determined at 86.

At 106 a fast scan of plunger voltage and bias voltage on each side is performed. The plunger voltage is scanned from $V_{p,max}$ to $V_{p,min}$. The plunger bounds are material specific and are limited by the upper and lower breakdown voltage (stop at 80% of breakdown voltage $V_{break}$) and by the possible range of interesting regions. The latter ranges from the fully gapless regime to full depletion and requires theory input. The resolution of the plunger scan needs to be sufficient to resolve individual subgap states crossing the gap (lever arm dependent). For each value of the plunger gate, the bias voltage at that terminal is scanned from $-1.5\Delta_0$ to $+1.5\Delta_0$ ($-350$ μV to $+350$ μV for Al)) with a resolution no larger than 5 μV. The reflected RF signal is measured as a function of plunger and bias voltage. The resulting two-dimensional scan is saved into the database. In other examples the RF can be replaced with DC measurement in a narrow bias range near zero bias.

The mapping data generated as an output of method 62A includes the following:
1. A calibration dataset consisting of two 2D cutter-field scans, on the left and right sides. For each point of this scan, three parameters are measured: RF in-phase component, RF out-of-phase component, and conductance of the respective side.
2. A measurement dataset including two 5D field-left-cutter-right cutter-plunger-bias scans, where the bias scan is taken on the left and on the right. For each point of this scan, two parameters are measured: RF in-phase component and RF out-of-phase component.

Figure 9:
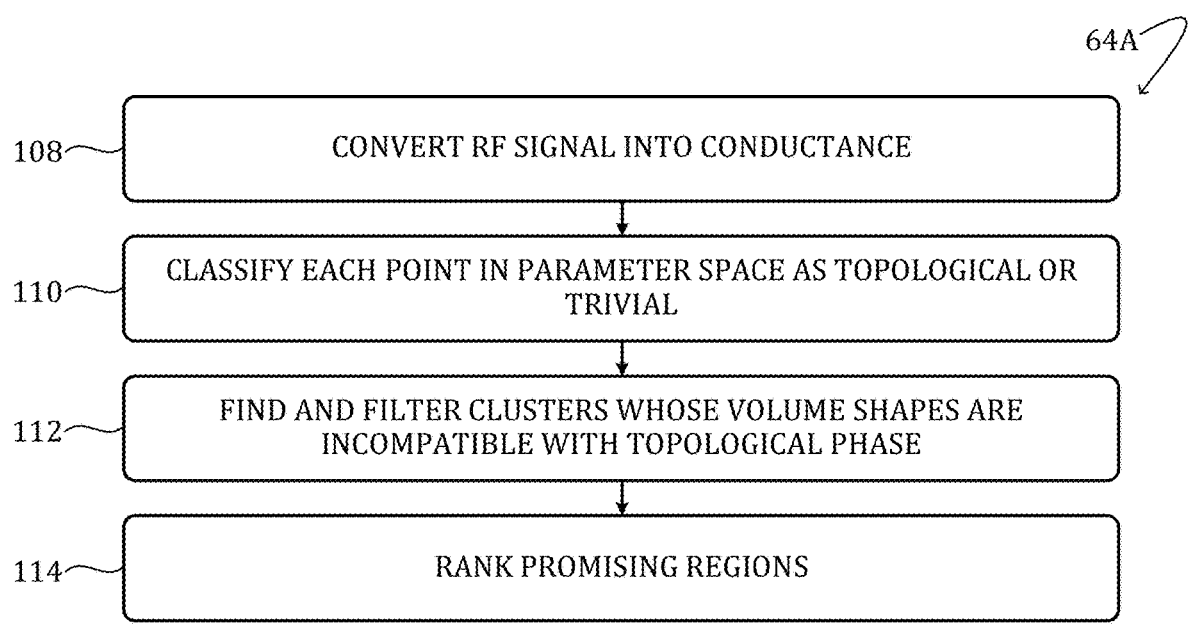
FIG. 9 shows aspects of an example method to find, by analysis of the data from the method of FIG. 8, regions of a parameter space consistent with an unbroken topological phase of a semiconductor-superconductor heterojunction.

The goal of data analysis at this stage is to identify the promising regions in the parameter space that are likely to contain an unbroken topological phase. FIG. 9 shows additional aspects of finding, by analysis of the mapping data, one or more regions of a parameter space consistent with an unbroken topological phase of a semiconductor-superconductor heterojunction.

At 108 of method 64A, the RF signal input is converted into conductance using the calibration dataset to define a transfer function. At 110 each point in the (field, plunger, cutter) parameter space is classified as (potentially) topological or trivial, using as input the local conductances of the respective left and right terminals, $G_{ll}$, $G_{rr}$, from bias traces measured at that point. In one example, the classification may check for the presence of ZBPs in both conductance traces.

Analysis of the mapping data includes density-based clustering on two-sided ZBP data which has been obtained from either RF or sub-RF measurements. At 112 clusters of points that have been classified as topological are found, and clusters whose volume or shapes in parameter space are deemed incompatible with a topological phase are filtered out. In some examples, the cluster volume must be larger than 0.03 V×T in the plunger voltage-magnetic field space. The clusters that survive the filtering are promising regions for the presence of topological phases. In some examples, this step may be implemented using density-based clustering for every 2D plunger-field scan, and may exclude regions that extend to zero magnetic field. At 114 the promising regions are ranked by the likelihood that they contain a topological phase. In some examples, the ranking score is determined by the average plunger gate voltage of each cluster, with priority being associated with more negative gate voltages.

Figure 10:
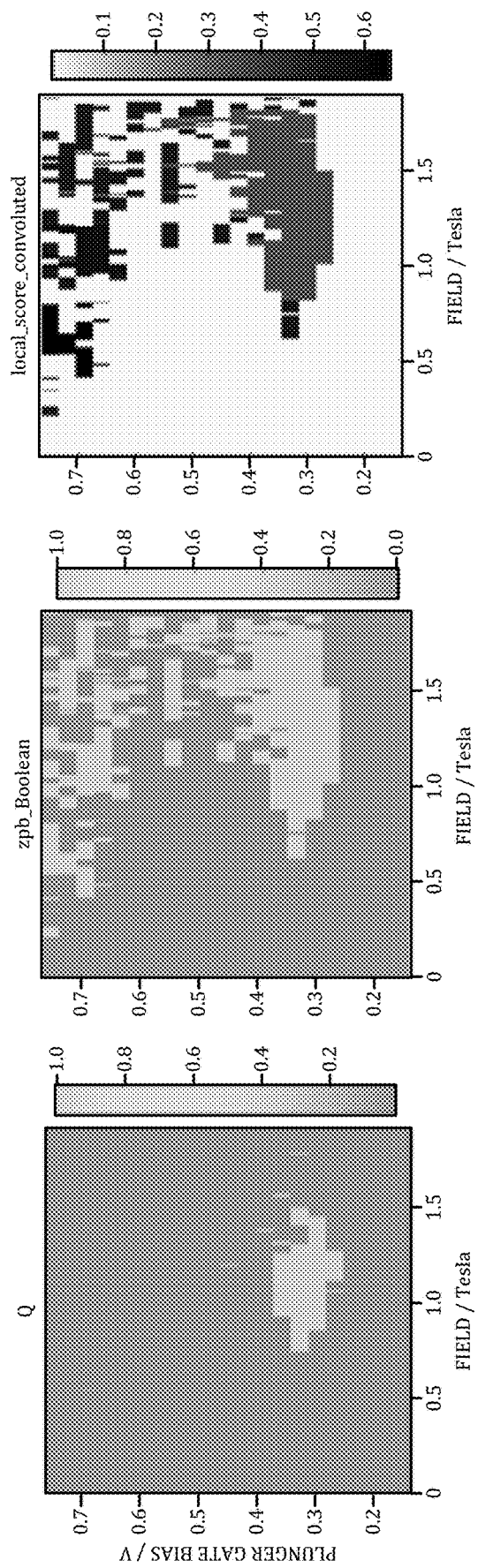
FIG. 10 shows aspects of analysis of mapping data according to the method of FIG. 9.

FIG. 10 shows aspects of analysis of mapping data according to method 64A. The analysis is illustrated and verified using a simulated dataset of an InSb/Al nanowire with length L=3 μm and a mean free path of 3 μm. From left to right as functions of plunger gate (in V) and magnetic field (in T) the figure shows: topological index Q as calculated from scattering matrix; a binary array where 1 corresponds to the ZBP present on both sides of the device; and clustered ZBP Boolean data with the cluster color corresponding to the score of the corresponding cluster (smaller corresponding to better). With such data, it is possible to find regions that include a true topological region, for further analysis.

The results of the data analysis performed in mapping phase 58 of method 56 determine the measurements to be taken in the subsequent refinement phase 60. For each promising region in the above ranking, ranges in field, plunger and cutter values that enclose the region are specified as input for the refinement phase. In some examples, the refinement phase may be performed on the various identified regions in the ranking order. It is necessary to minimize the wait time between the end of the measurements in the mapping phase and the beginning of the measurements in the refinement phase, in order to minimize the effect of gate drifts, gate jumps and other problems that may occur while the device is idle. For this reason, it is important for the data analysis outlined above to be executed in a time-efficient manner. Note that the raw data generated in the RF measurement phase can be quite large: existing RF datasets of this kind exceed 100 GB in total size, with reduction and analysis spanning a few hours.

Refinement Phase 60 in Detail

Figure 11:
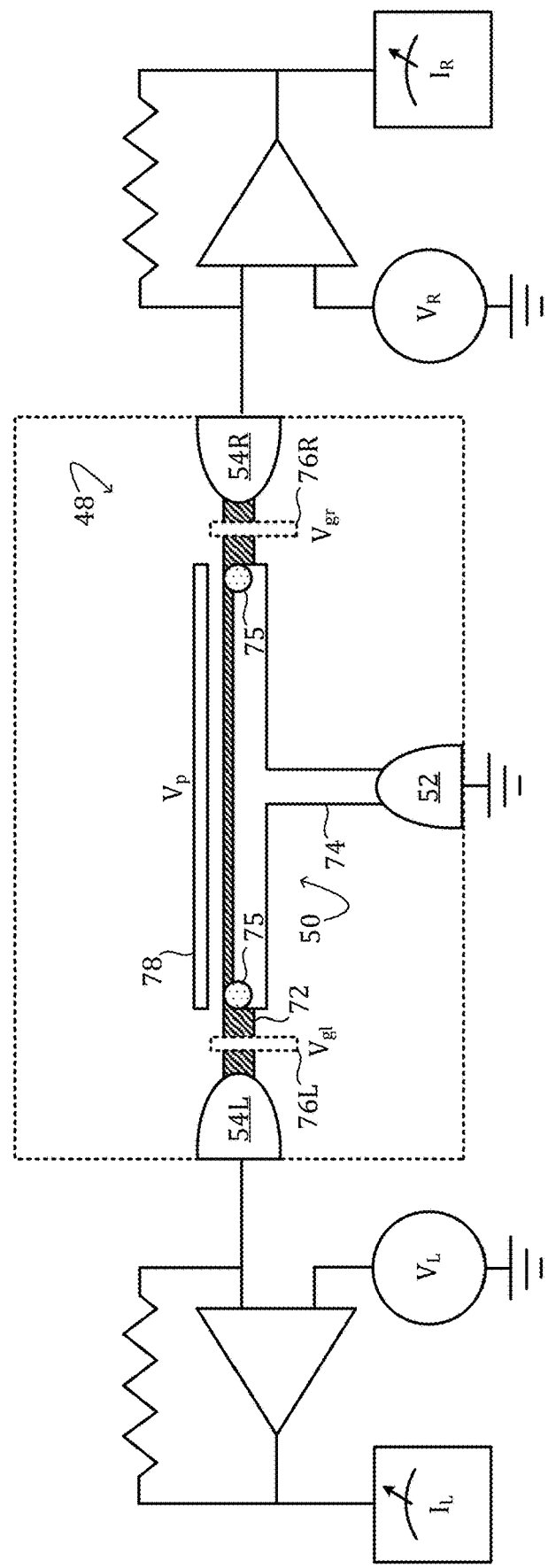
FIG. 11 shows aspects of an example sub-RF conductance test circuit.

The refinement phase is undertaken in order to look at promising regions in more detail. Depending on the implementation, the refinement phase may be enacted using either RF or DC/sub-RF measurement. In one example, the differential conductance of the device being evaluated can be measured using standard, low-frequency lock-in amplifier techniques, as represented in FIG. 11. The full conductance matrix is measured by applying a DC bias voltage $V_{bias,l/r}$ and an AC voltage $\delta V_{l/r}$ at the left and right terminals 54, respectively, with two different AC excitation frequencies, $f_l$ and $f_r$. These frequencies must be lower than the low-pass filter cutoff values in the system and low enough to minimize parasitic capacitance effects. To ensure this, the phase shift of the current with respect to the voltage excitation must be less than 10°. The in-phase AC current $\delta I_{l/r}$ flowing to the left or right side is measured with the middle superconducting lead grounded. It is necessary that the connection to ground is low-ohmic (i.e., typically less than a few kΩ) compared to the resistance of the other two lines, in order to suppress spurious voltage divider effects. To that end, either the low-pass filters may be designed accordingly or the superconducting lead may be grounded at the PCB level (cold ground).

This three-terminal setup allows measurement of all four elements of the conductance matrix G between the left (l) and right (r) terminals:

$$G = \begin{pmatrix} dI_l/dV_l & dI_l/dV_r \\ dI_r/dV_l & dI_r/dV_r \end{pmatrix}. \quad (4)$$

The conductance matrix elements $G_{ll}=dI_l/dV_l$ and $G_{rr}=dI_r/dV_r$ are referred to as 'local conductance' and the elements $G_{lr}=dI_l/dV_r$ and $G_{rl}=dI_r/dV_r$ as 'non-local conductance'.

The input for refinement measurement 66 includes a region in (cutter gate, plunger gate, field) space that is a candidate for further investigation. The size of the regions in plunger gate/field space may be increased by a 20%, in some examples, to ensure that the refinement measurements fully capture the topological phase transition surrounding each region.

Figure 12:
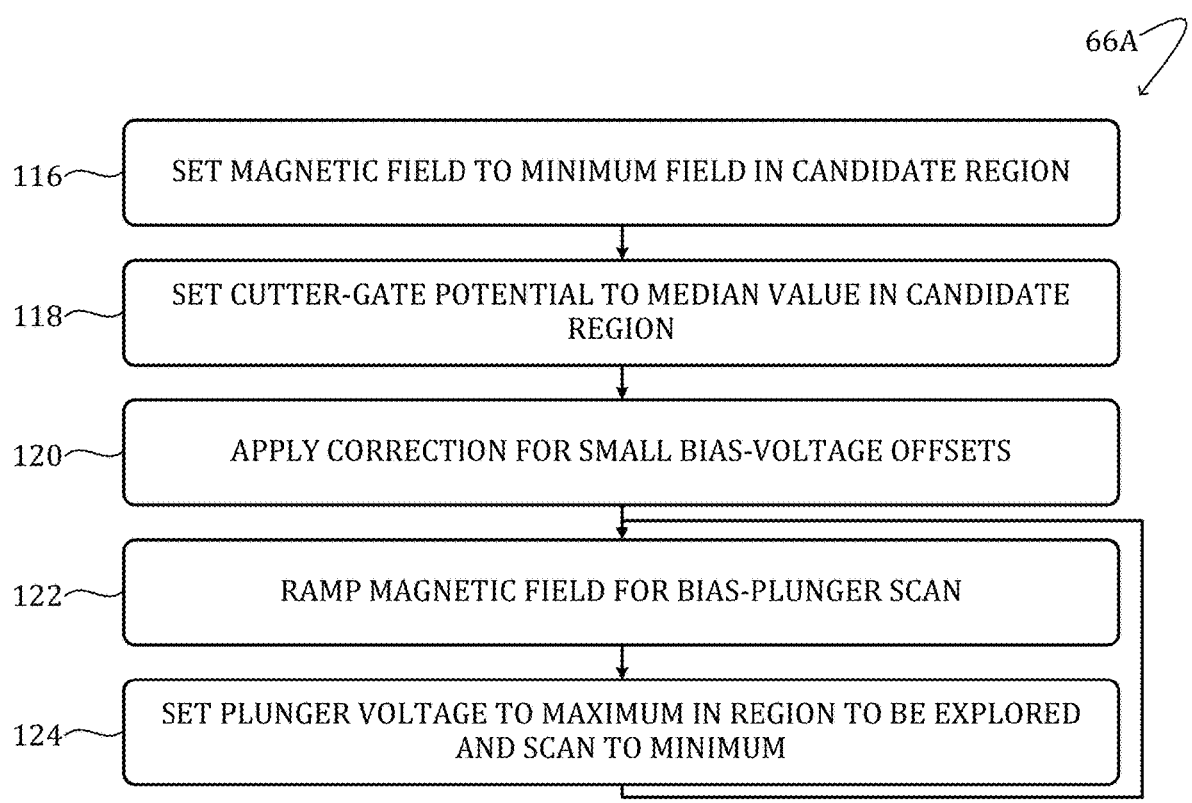
FIG. 12 shows aspects of an example method to measure the sub-RF conductance of a semiconductor-superconductor heterojunction.

FIG. 12 shows additional aspects of measuring a sub-RF conductance of the semiconductor-superconductor heterojunction in each of the one or more mapped regions of the parameter space, to obtain refinement data. In particular, method 66A describes local and non-local conductance measurements suitable for extracting an energy gap of the semiconductor-superconductor heterojunction.

At 116 of method 66A, the magnetic field is set to the minimum field value in the candidate region. This field should be low enough that the induced gap is still open, for the purpose of observing whether it closes in the candidate region. At 118 the cutter gate is set to its median value, for instance, in the candidate region. At 120 a correction is applied for small bias voltage offsets of $V_L$ and $V_R$ (cf. FIG. 11), to ensure that the extraction of the antisymmetric component of the local and non-local signals is straightforward. This can be achieved by finding the minimum of the summed absolute currents ($|I_L|+|I_R|$) in the $V_L$–$V_R$ parameter space. At 122 the magnetic field is ramped in the candidate region in steps of ΔB. For each value of the field, the bias-plunger scan is performed as described immediately below.

At 124 the plunger voltage is set to the maximum plunger voltage in the region to be explored ($V_{p,max}$). The plunger voltage is scanned from $V_{max}$ to the minimum plunger voltage in the region to be explored, $V_{p,min}$, in steps of $\Delta V_p$. In other examples, the plunger voltage may be scanned in the opposite direction. For each plunger voltage value, the bias voltage on the left terminal is scanned from −50 μV to +50 μV in steps of 5 μV. If the data indicates that the topological gap is outside of this window, then the scan is repeated with larger window size. The resulting two-dimensional scan is saved into the database.

The refinement data generated by the slower full-conductance matrix measurement is a dataset per candidate region. Each dataset consists of two 3D field-plunger-bias scans, where the bias is scanned separately on the left and the right sides. For each point in the scan, two parameters are measured: conductance on the left and on the right sides. In some examples the dimensionality of the dataset can be increased to also include scans of the cutter voltages, for example. In some examples, each conductance may comprise the full conductance matrix for the corresponding side of the device.

Figure 13:
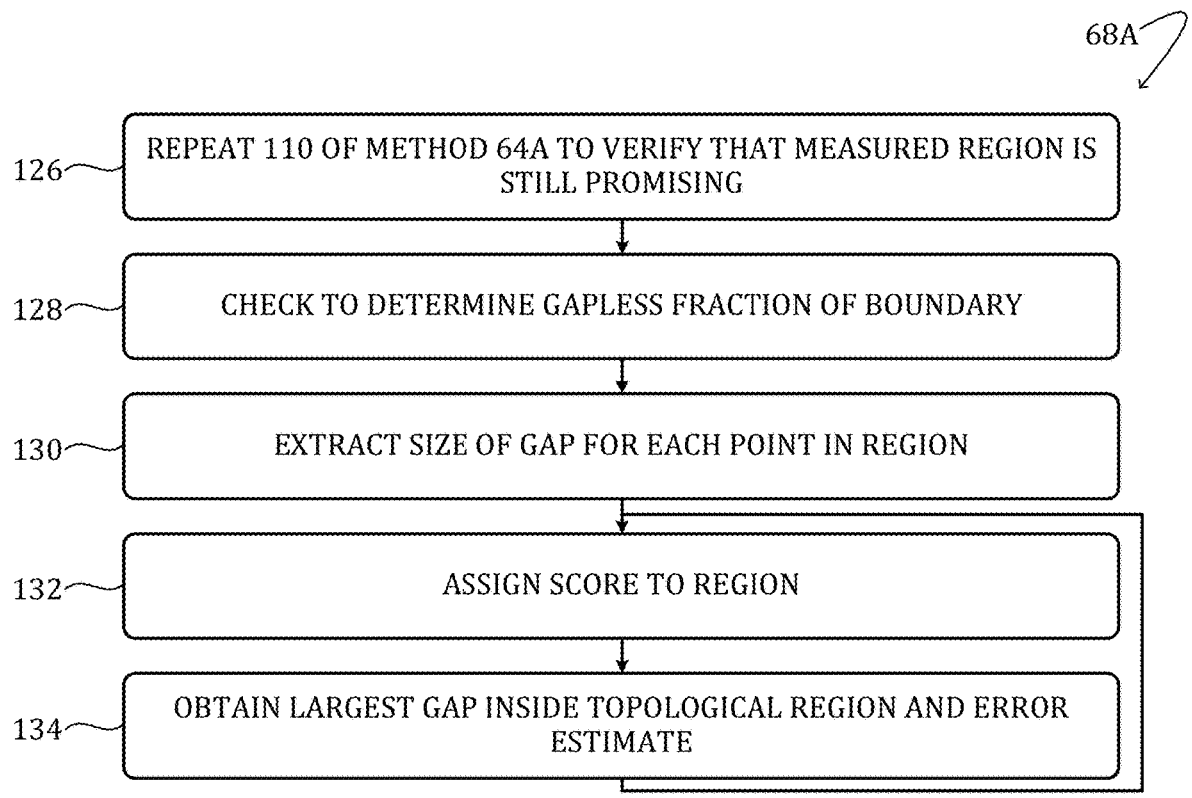
FIG. 13 shows aspects of an example method to find, by analysis of the data from the method of FIG. 12, a boundary of an unbroken topological phase in parameter space and a topological gap of a semiconductor-superconductor heterojunction.

FIG. 13 shows additional aspects of finding, by analysis of the refinement data, a boundary of the unbroken topological phase in the parameter space and a topological gap of the semiconductor-superconductor heterojunction for at least one of the one or more regions of the parameter space interrogated in method 66A. In some examples, the illustrated method is performed iteratively for each promising region.

At 126 of method 68A, step 110 of method 64A is repeated in order to verify that the measured region is still promising, and potentially to adjust the boundaries of the candidate topological region. At this point, analysis of the refinement data includes verifying gap closure at the boundary of each of the one or more regions of the parameter space. At 128 a check is performed to determine what fraction of the boundary of the promising region is gapless, based on the non-local conductance signal. At 130 the size of the gap $\Delta^{(j)}$ for each point i within the region j is extracted by thresholding the non-local conductance. At 132, based on the extent of a gapless boundary, and on the value of the gap within the candidate topological region, a score is assigned to the region. The score reflects the likelihood that the promising region is indeed topological and gapped. In some examples, the score S is defined by $S_j=X \cdot \text{median}_i(\Delta_{(j)})$. At 134 the largest gap inside each topological region is obtained, together with an estimate of the error. In some examples, the error bar is dictated by the uncertainty in the thresholding of non-local conductance at the point of the largest gap. This score is one of the possible scores with median gap replaced by maximal as an example alternative score.

Figure 14:
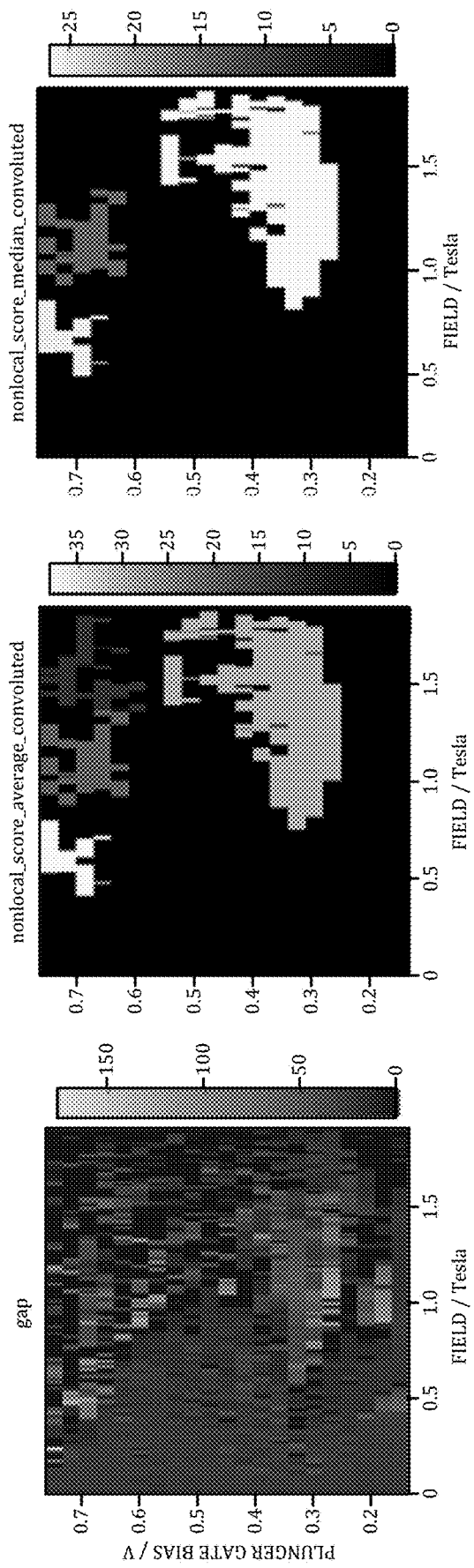
FIG. 14 shows aspects of analysis of refinement data according to the method of FIG. 13.

The output of this analysis includes a set of probabilities corresponding to the regions identified in mapping phase 58 of method 56—viz., the probability of hosting an unbroken topological phase. Associated with each probability is the maximal (topological) gap inside each of the (non-trivial) regions. FIG. 14 shows aspects of analysis of refinement data according to method 68A, using the same simulation as in FIG. 10. From left to right: gap extracted from the non-local data; score of the ZBP clusters as defined by average gap within the region times the percentage of the boundary that is gapless; and score of the ZBP clusters, same as the middle figure, but with average gap replaced by the median gap in the region. The maximal gap within the region is 175 μeV. Accordingly, the output of the overall method 56 is an estimate for the value of the topological gap in each promising region and its position in the explored parameter space.

Detailed Examples of False Positives and False Negatives

One possible issue of quasi-Majoranas is that they can occur as precursors of a true topological regime. This means a topological region could be directly adjacent (in parameter space) to a non-topological quasi-Majorana regime. In that case, the current algorithm that clusters regions of correlated ZBPs could identify a region that is too large in the mapping phase. In other words, while containing the topological region, the identified region could extend much farther, including some of the quasi-Majorana regime. In that case, the current analysis in the refinement phase is set up to fail by either identifying too much of parameter space as topological or not recognizing the topological regions because of the absence of gap closing/reopening in the quasi-Majorana regime.

A solution to this problem is to implement another clustering algorithm in the refinement phase that identifies lines of gap-closing/reopening features in parameter space (specifically in field-plunger space), and then determine intersections of these lines with the regions of correlated ZBPs to find topological phases. Note that this is mostly a problem of data analysis in the refinement phase. The mapping phase is still suitable for identifying promising regions of data that are examined more closely in the refinement phase.

Unstable behavior in data analysis may result from cuts of the data for a fixed cutter voltage. Stability can be improved by using one or both cutter-gate potentials as additional dimensions in refinement data analysis 68. This should improve clustering and make better use of the available dataset.

The following example addresses smooth potentials at the ends of the semiconductor wire, which are associated with quasi-Majoranas and false negatives. The presence of long-range inhomogeneities (smooth potential variations) can make it more difficult to observe the gap-closing/reopening features, thus leading to false negatives. Interestingly, smooth potential variations are also the regime in which one would expect quasi-Majorana modes. Here the interplay between the two effects is discussed.

Figure 15:
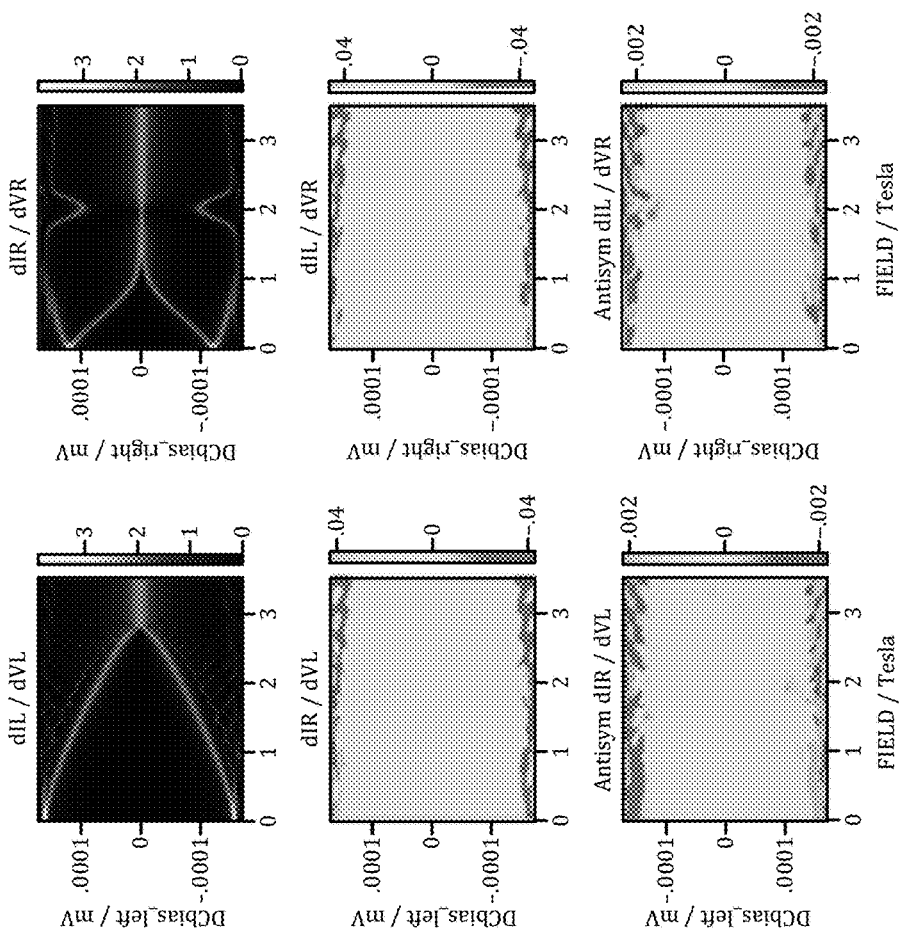
FIG. 15 shows the effect of a smooth potential at the right end of a semiconductor wire in a 1D model of a semiconductor-superconductor heterojunction.
Figure 15:
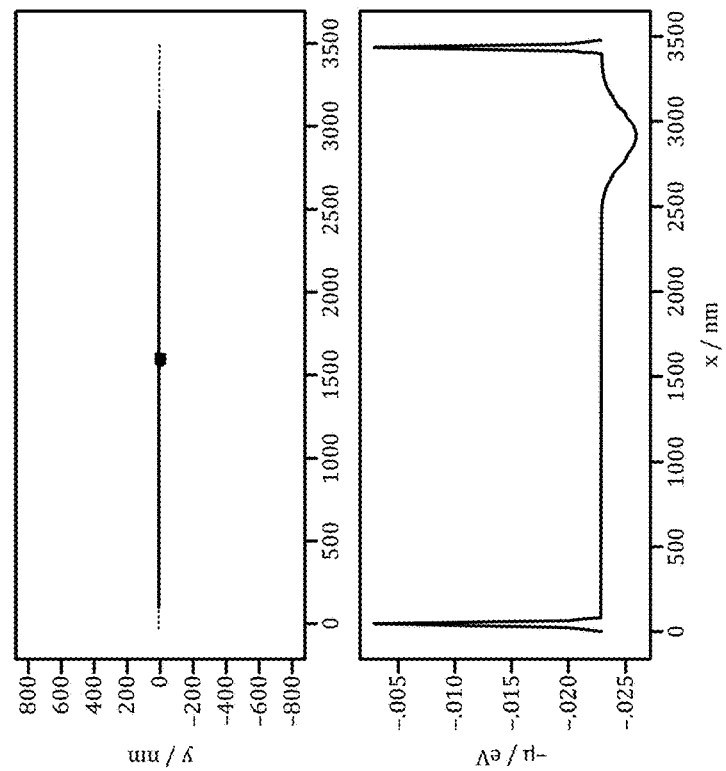

A typical scenario where quasi-Majorana modes appear is when a system is tuned close-to but outside of the topological phase. For concreteness, consider an example where at a fixed magnetic field the chemical potential $\mu$ is smaller than the critical chemical potential $\mu_C$ required to enter the topological phase. A smooth potential variation can be interpreted as a spatially varying chemical potential $\mu(x)=\mu_0 V(x)$, where $V(x)$ is the potential. In the above scenario, it is possible for a potential dip close to the (here right) end of the semiconductor wire, as shown in FIG. 15, to locally tune the system into the topological regime $\mu(x)>\mu_C$, which leads to a local pair of Majorana modes. The latter manifest in the local conductance at the right end at much lower fields as the topological phase transition in the bulk of the semiconductor wire (which can be read off via the local conductance at the other (left) end where no smooth potential variation is present).

FIG. 15 shows the effect of a smooth potential at the right end of the semiconductor wire in a 1D model. Left: Spatial dependence of the potential (lower panel) and position of the superconducting shell implemented via self-energy (orange, upper panel) of the semiconductor wire. Right: Conductance matrix including the antisymmetric part of the non-local conductance. Note that there is no gap-reopening feature in the non-local conductance. The only feature of the phase transition is the onset of weak Majorana oscillations.

Specifically, in the example in FIG. 15, the phase transition at fixed chemical potential is at $B_C \approx 2.7$ T. The ZBPs due to quasi-Majorana modes appearing around $B \approx 1$ T would correctly be labeled as non-topological in method 56 since there is no gap closing and reopening feature in the non-local conductance. However, even at the topological phase transition there is no gap-closing/reopening feature visible. The reason is that the part of the system under the smooth potential at the right side already went through the phase transition and is therefore gapped when B crosses $B_C$. This suppresses the signal of the bulk modes at the phase transition since they couple only evanescently to the right lead. Note that in this particular model the topological gap is 100 µeV and thus larger than we would expect in realistic systems. For a smaller gap, the non-local signal becomes larger thus increasing the strength of the gap-closing/reopening feature. Nevertheless, since the signal of the finite-size oscillations will also become stronger, it can remain difficult to observe the gap-closing/reopening.

In conclusion, while quasi-Majorana modes at the end of the semiconductor wire do not lead to false positive features in the non-local conductance, the presence of quasi-Majorana modes increases the chance of false negatives once the system is tuned into the topological phase.

A second example addresses smooth potentials in the center of the semiconductor wire, associated with false positives. Here we discuss the only example identified that can have ZBPs at both ends of the semiconductor wire and a non-trivial feature in the non-local conductance that could be interpreted as a gap closing (and potentially a reopening), while the bulk of the system is non-topological.

Figure 16:
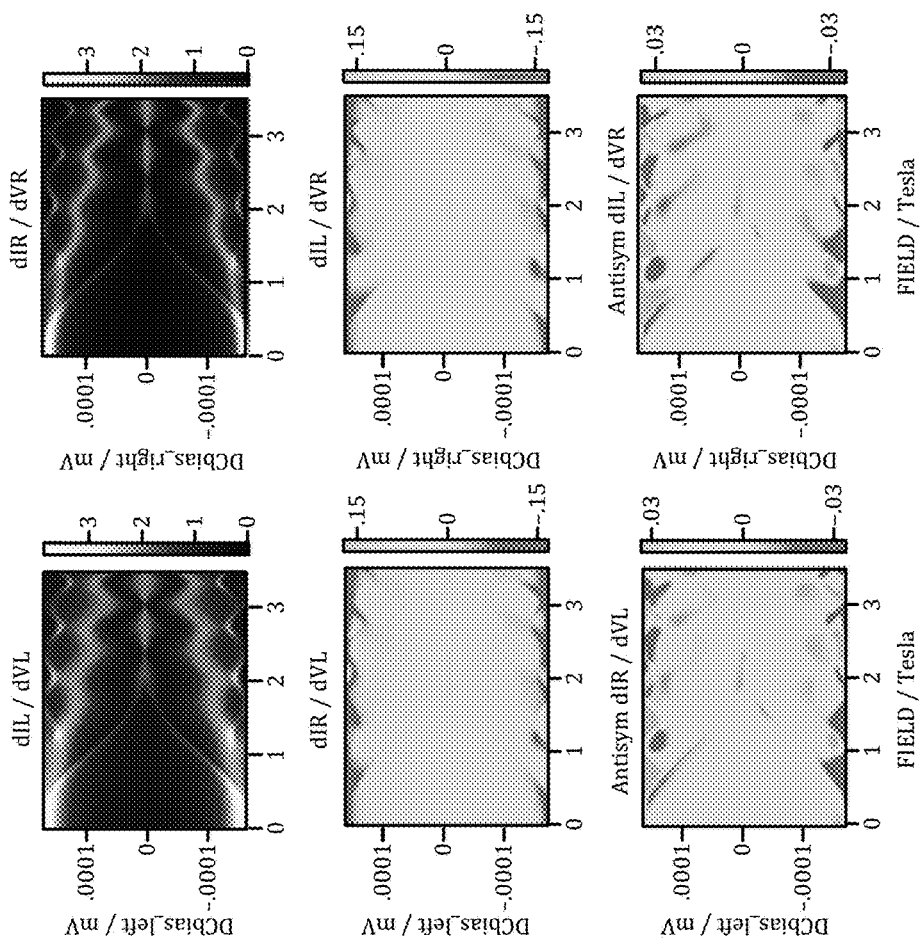
FIG. 16 shows the effect of smooth potential at the center of a semiconductor wire in a 1D model of a semiconductor-superconductor heterojunction.
Figure 16:
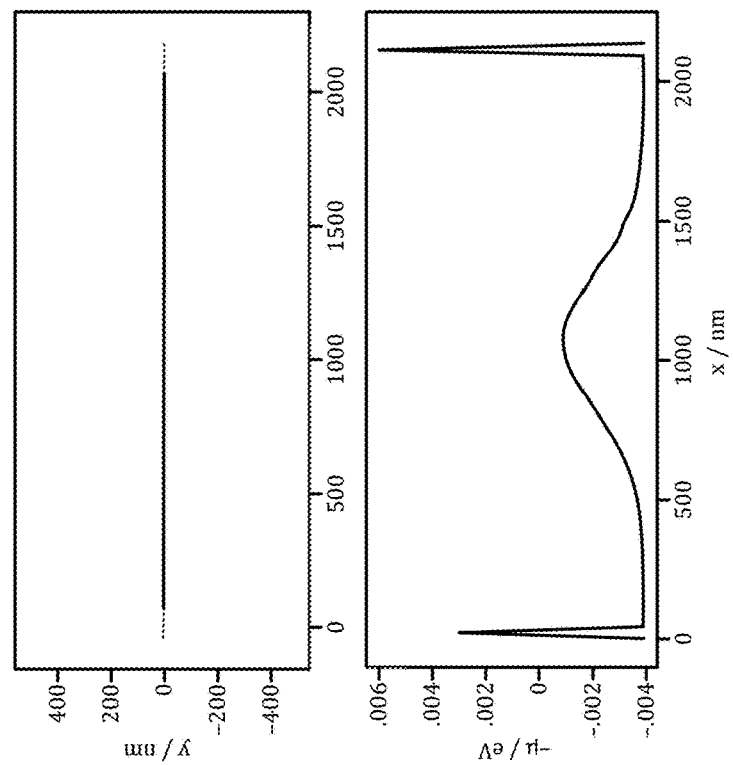

The setup is depicted in FIG. 16. The bulk of the semiconductor wire is tuned to be non-topological while a smooth potential bump in the center of the semiconductor wire reaches the topological regime of the potential. One can therefore think of a pair of Majorana zero modes nucleating in the center of the semiconductor wire. While the center region is chosen too small for well-separated Majorana modes, the smoothness of the potential could lead to close-by but weakly-coupled quasi Majorana modes in the center of the semiconductor wire.

Due to finite-size effects, the corresponding zero modes can be probed as correlated ZBPs in the conductance at each end, as shown in FIG. 16. Moreover, since the low-energy modes at the center overlap with both sides they also contribute to the non-local conductance, which could be misinterpreted as a gap closing.

FIG. 16 shows the effect of smooth potential at the center of the semiconductor wire in a 1D model. Left: Spatial dependence of the potential (lower panel) and position of the superconducting shell implemented via self-energy (orange, upper panel) of the semiconductor wire. Right: Conductance matrix including the antisymmetric part of the non-local conductance. Note that due to finite-size effects the quasi-Majorana modes nucleated in the center regions are visible as correlated ZBPs and also contribute to the non-local conductance.

Figure 17:
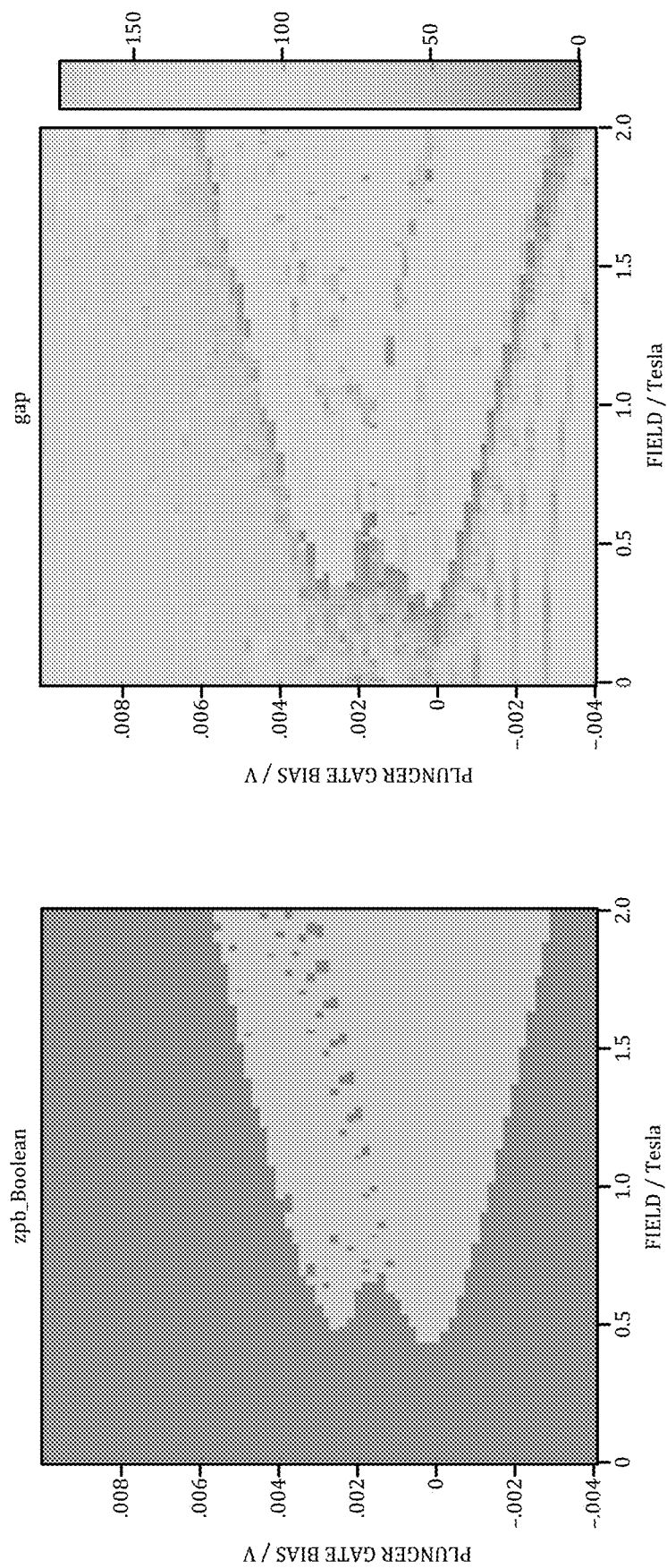
FIG. 17 shows the result of data analysis over field/plunger parameter space for a 1D model of a semiconductor-superconductor heterojunction with a potential bump in the center of the semiconductor wire.

FIG. 17 illustrates data analysis over field/plunger parameter space of the gap method for a 1D model with a potential bump in the center of the semiconductor wire. Left: Detected ZBPs. Right: Gap determined from the data. In this case, the ZBP finder detects two overlapping regions: one centered around plunger=0 (bulk topological region) and one centered around plunger=0.0025 (center bump topological). It is unclear whether this case represents a false positive (outside of the bulk topological region) because there is a small topological region in the center, and finite-size effects are significant. In fact, finite-size effects lead to features in the gap-closing of each of the regions (center and bulk) in the estimated gap extracted from the data.

This problematic example illustrates the value of continued development of the data analysis used in the methods herein. Note that the ZBP clustering algorithm has identified both regions (center and bulk) as a single region. This example illustrates how non-topological regions adjacent to topological regions may be comparatively difficult to separate and may require further refinement in data analysis.

Figure 18:
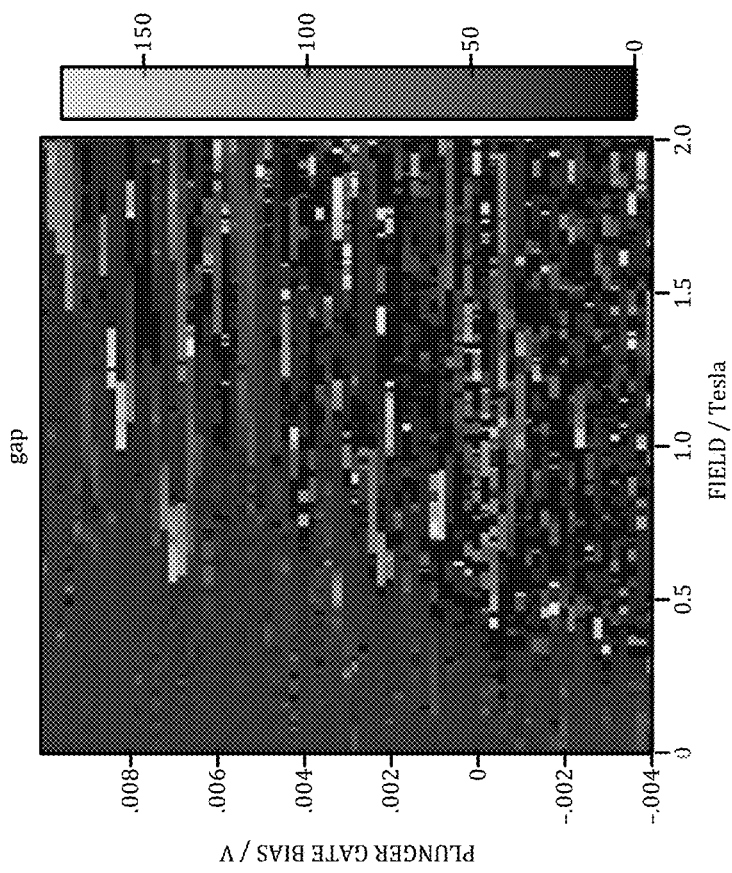
FIG. 18 shows the result of data analysis over field/plunger parameter space of a strongly disordered 1D model of a semiconductor-superconductor heterojunction.
Figure 18:
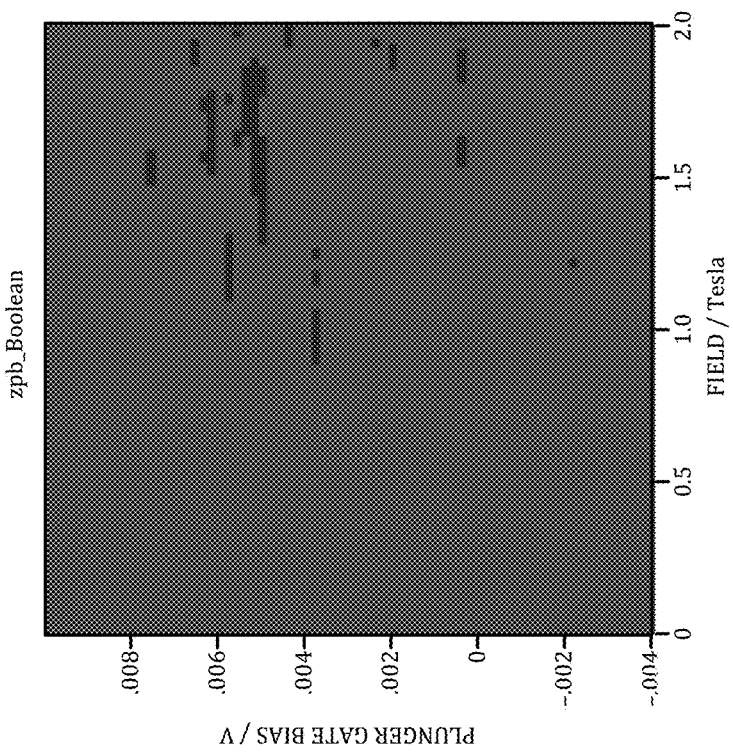

A third example relates to non-topological ZBPs due to strong disorder. Represented here is an example of a one-dimensional model with strong disorder. To illustrate, FIG. 18 shows data analysis over field/plunger parameter space of a strongly disordered 1D model. Left: points of correlated ZBPs (red) Right: extracted gap at each point in parameter space. While ZBPs are present, the data in FIG. 18 indicates that the regions of correlated ZBPs are sparse and largely disconnected. Strongly disordered region can thus be ruled out by the gap method by adding requirements for the size and continuity of the identified regions.

Instrumentation and Additional Methods

Figure 19:
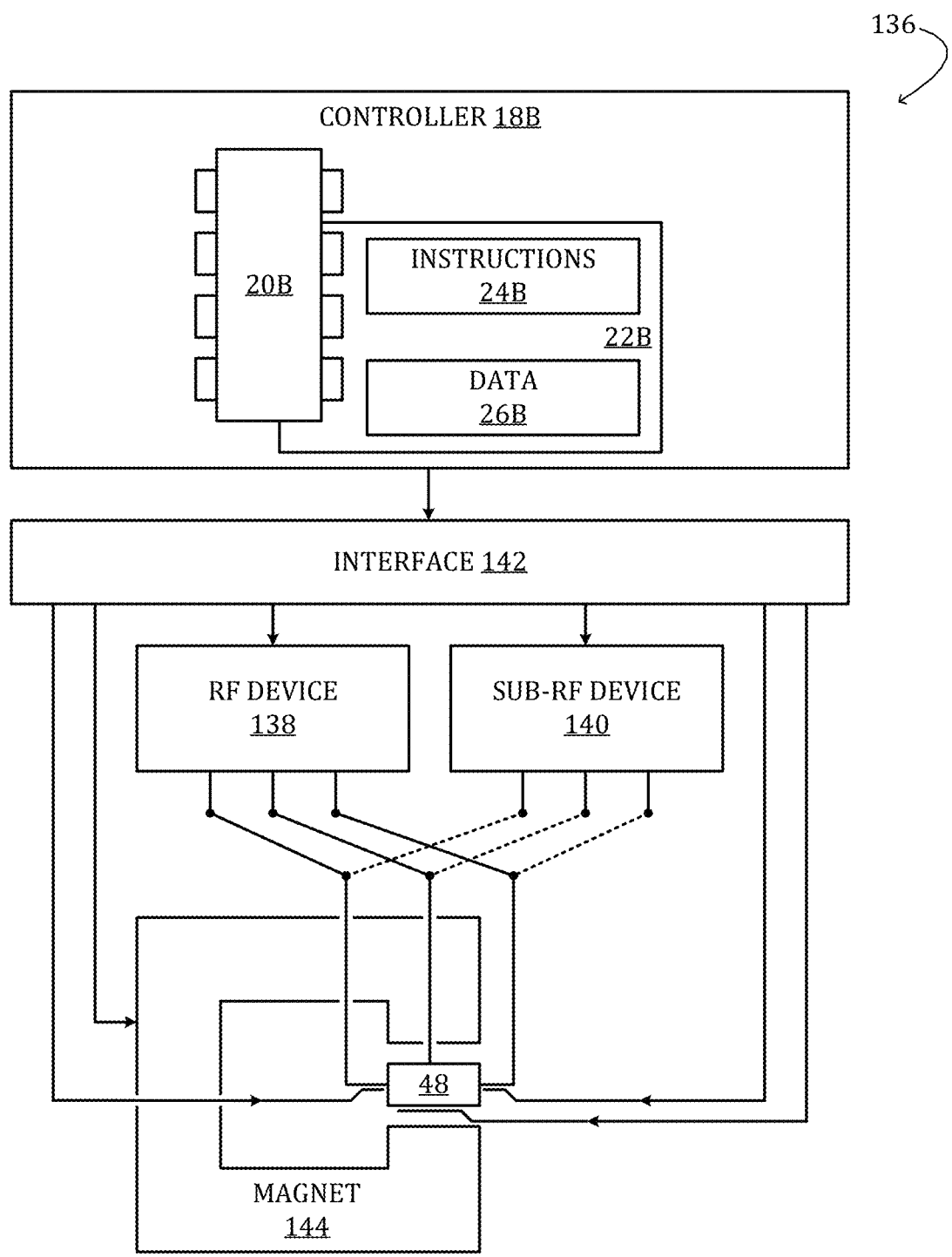
FIG. 19 shows aspects of an example instrument configured to evaluate a semiconductor-superconductor heterojunction for use in a qubit register of a topological quantum computer.

While the features and examples disclosed herein relate to methods for evaluating a semiconductor-superconductor heterojunction for use in a qubit register of a topological quantum computer, such features and examples are also applicable to related instrumentation. FIG. 19 shows aspects of an example instrument 136 configured to evaluate a semiconductor-superconductor heterojunction for use in a qubit register of a topological quantum computer. Instrument comprises a controller 18B. The controller includes at least one processor 20B and computer memory 22B coupled operatively to the processor. The computer memory is configured to hold instructions 24B that cause the processor to enact the various measurement and analysis methods described herein. To that end, the processor may be coupled operatively to RF admittance-measurement device 138 and to a sub-RF conductance-measurement device 140. The RF admittance-measurement device may include features as illustrated in FIG. 7; the sub-RF conductance-measurement device may include features as illustrated in FIG. 11. In the illustrated example, instrument 136 includes an interface 142 that couples the processor to the measurement devices and also provides control signals to the electrostatic gates of device 48 and to magnet 144.

Figure 20:
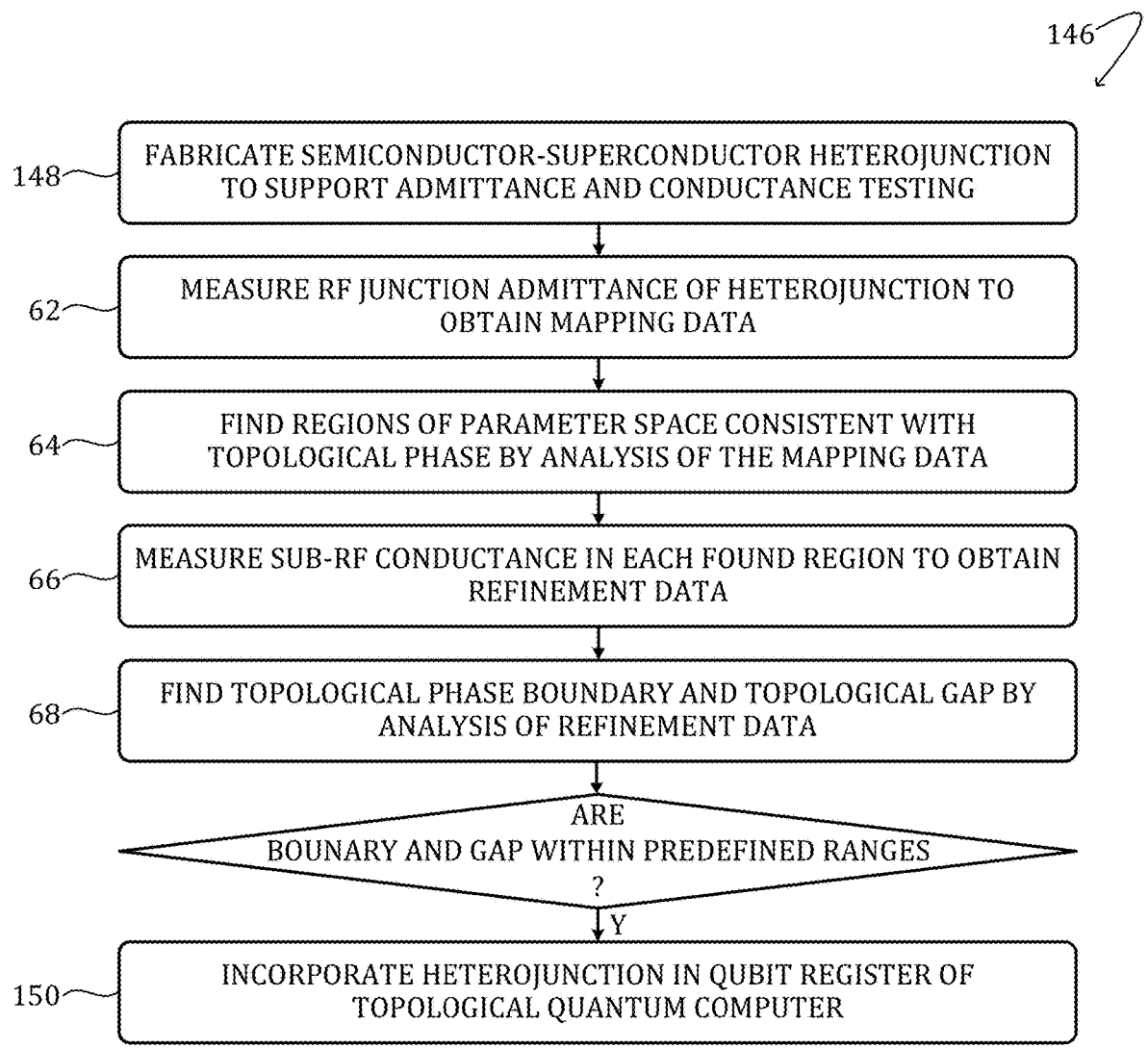
FIG. 20 shows aspects of an example method for building a topological quantum computer.

The features and examples disclosed herein relate equally to methods for building a topological quantum computer. FIG. 20 shows aspects of an example method 146 for building a topological quantum computer.

Fabricated at 148 of method 146 is a semiconductor-superconductor heterojunction having at least three terminals configured to support electronic admittance testing. At 62 RF junction admittance of the semiconductor-superconductor heterojunction is measured to obtain mapping data. At 64, by analysis of the mapping data, one or more regions of a parameter space consistent with an unbroken topological phase of the semiconductor-superconductor heterojunction is found. At 66 a sub-RF conductance of the semiconductor-superconductor heterojunction is measured in each of the one or more regions of the parameter space, to obtain refinement data. At 68, by analysis of the refinement data, a boundary of the unbroken topological phase in the parameter space and a topological gap of the semiconductor-superconductor heterojunction are found for at least one of the one or more regions of the parameter space. At 150 the semiconductor-superconductor heterojunction is incorporated into a qubit register of the topological quantum computer, provided that the found boundary and topological gap are within respective, predefined ranges. In operation of the topological quantum computer built in this manner, one or more values characterizing the boundary in the parameter space may be used as tuning parameters for addressing the semiconductor-superconductor heterojunction in the qubit register.

No aspect of the foregoing drawings or description should be understood in a limiting sense, because numerous additions, omissions, and variations are also envisaged. As discussed above in the context of FIG. 6, ff., Majorana zero modes may be found in two phases using a three-terminal device (e.g., device 48 of FIG. 5), where for the first phase (i.e., mapping phase 58 of FIG. 6) the measurement is done in RF and for the second phase (i.e., refinement phase 60) the measurement is done at lower frequency or DC. Data analysis of output data from the first phase effectively 'converts' the output of the first phase into an input suitable for the second phase. Final analysis of the output data from the second phase is then the basis for prediction of the presence and extent of a topological region useful for topological quantum computing. In other examples, however, discrete and unbroken phases of RF and DC measurement, and corresponding discrete and unbroken phases of data analysis, may not always be necessary.

Figure 21:
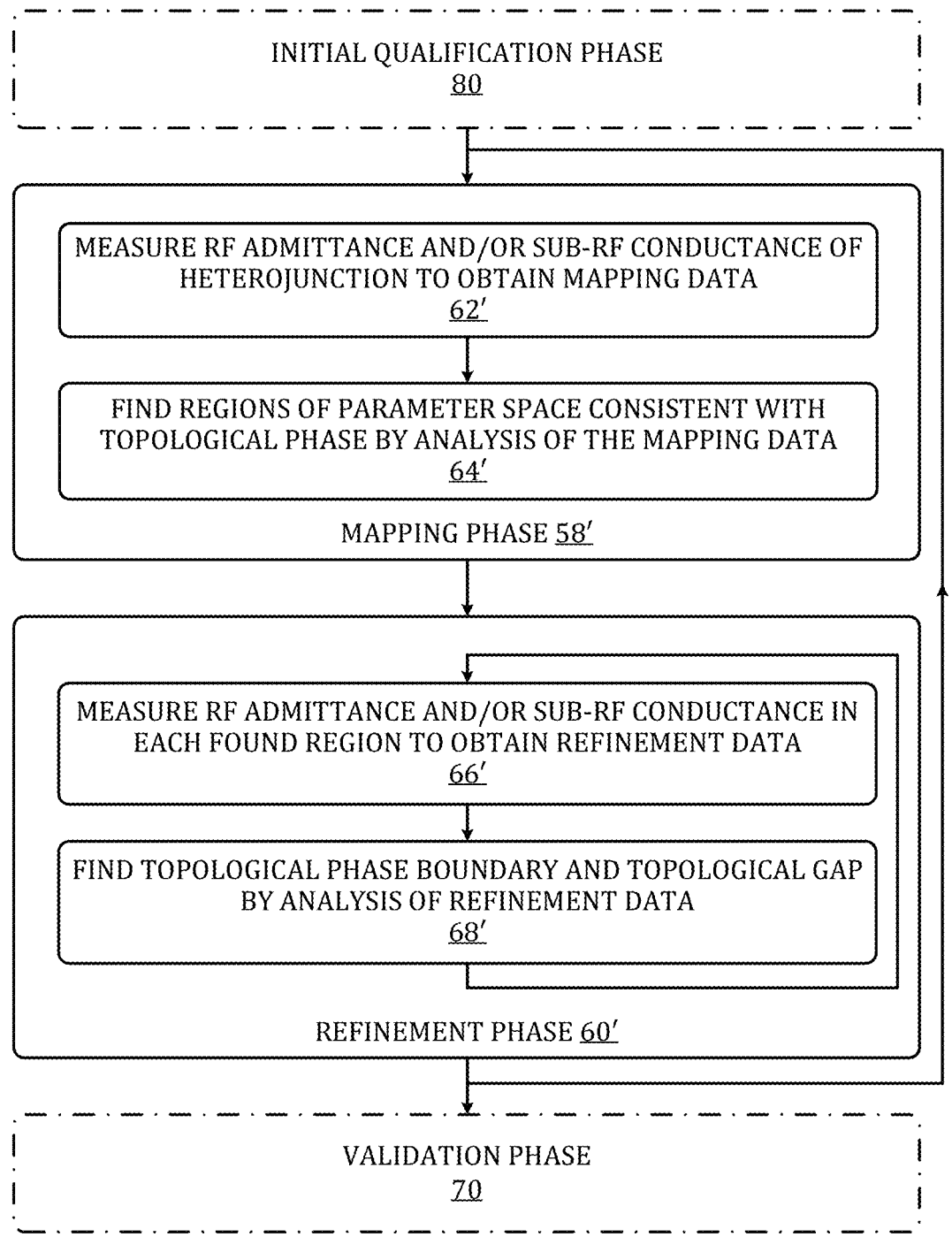
FIG. 21 shows aspects of another example method to evaluate a semiconductor-superconductor heterojunction for use in a qubit register of a topological quantum computer.

One example of the variants envisaged is illustrated in FIG. 21, which shows aspects of an example method 56' to evaluate a semiconductor-superconductor heterojunction for use in a qubit register of a topological quantum computer. Method 56' includes a mapping phase 58' and a refinement phase 60'. At 62' mapping data is obtained by measuring RF admittance and/or sub-RF conductance of a semiconductor-superconductor heterojunction as described herein. At 64' the mapping data is analyzed in order to find regions of the parameter space consistent with a topological phase. At 66' refinement data is obtained by measuring RF admittance and/or sub-RF conductance of the semiconductor-superconductor heterojunction, focusing on any, some, or all of the regions found at 64'. At 68' the refinement data is analyzed in order to find the corresponding topological phase boundary and topological gap in each region of focus.

For instance, operationally analogous measurements may be performed without separation into discrete and unbroken phases, as analogous (e.g., equivalent) hardware and extraction methods may allow for fast RF or DC measurements on the entire parameter space of a heterojunction device or on a predetermined region thereof. In this case, data analysis of the afore-mentioned second phase of measurement (68 in FIG. 6) may be applied to a single phase of measurement. The advantage of this variant may be one of speed (if an RF technique is used) or thoroughness (if a sub-RF or DC measurement is applied to the entirety of the parameter space, or to a predetermined region thereof). Another advantage may be a combination of speed and additional information, if only a small bias window near zero bias is measured in a sub-RF technique, or the second and third harmonics of the signal are measured (vide supra).

In some examples, a two-stage protocol may yet be performed, in first and second phases, but both phases may be either RF or DC. Here the second phase may be a fine-resolution scan of a sub-region revealed in the first phase. Data analysis enacted on the results of each phase may be akin to the data analysis from the second phase (68 in FIG. 6), with the output region defined by the first phase of analysis serving as the input region for the second phase of measurement.

In some examples, real-time analysis of the data from the first phase of measurement may trigger an abrupt transition to the second phase of measurement when a promising region is identified, as opposed to waiting for the entire parameter space to be covered prior to refinement. This variant may decrease the overall time of assessment, especially if the parameter space to be covered is very large and/or the first phase of measurement is a low-frequency or DC measurement.

In some examples, transitions in both directions between first- and second-phase measurement may be enabled, such that the mode of data acquisition alternates between the two phases. In that manner, adaptive measurement of the parameter space is carried out, with narrowing refinement of the found parameter values—i.e., fine-resolution scans—being performed only when necessary. This tactic may result in efficient scanning of a large parameter space. In a more particular example, initial first-phase measurement may be coarse-grained in the magnetic field and gate voltage, but may be adjusted following intermittent second-phase data analysis in order to map out regions of interest at a higher resolution. Likewise, the bias-voltage range can be adjusted dynamically to allow for bulk-gap extraction after an initial gap closing is detected.

In some examples, any of the measurement-and-analysis sequences considered herein may be performed on a tetron-qubit device with an additional grounding terminal. By grounding the tetron one can measure transport through the two regions that are tuned into the topological regime simultaneously. In these examples, the tuning of plunger and cutter gates in the two regions may be done separately, but the magnetic field may be applied globally. Here the looping over parameters may be enacted such that the outer loop is the magnetic field loop, to allow for simultaneous measurements of the two regions. Data analysis here may be enacted as in the approach of FIG. 13, for example, but success is claimed only if the topological regimes for the two regions overlap in magnetic field values. For qubit operation after such tuning, the tetron qubit may be operated in an ungrounded state.

In an example similar to the tetron-qubit example directly above, any of the measurement-and-analysis sequences considered herein may be performed on hexon qubits or on a collection of many qubits—i.e., tetron-or-higher. One difference relative to the tetron-qubit example directly above is that success may be claimed only if three or more topological regimes overlap in magnetic field values.

In a further variant of the two examples directly above, any one of the existing (i.e., native) tetron and/or hexon terminals may be used as a grounding terminal. Here a current path through the device is used to ground individual qubits for 3-terminal-like measurements. In this variant, any of the measurement-and-analysis sequences considered herein may be performed in series, on different segments within the same qubit, but also may be performed in parallel across different qubits. Parallel interrogation of the qubits may be used to further define regions of interest identified by individual interrogation. For both methods, the end of one segment is used for grounding by opening the cutter gate as much as possible, while the other segment(s) are measured. For either tetron or hexon qubits, such an approach would involve performing the protocol at least twice on a subset of the regions to be tuned to a topological regime.

In some scenarios, these additional examples may increase the speed of tuning a topological quantum computer and may also increase confidence in the obtained topological phase.

For additional context, the following references are hereby incorporated herein by reference, for all purposes.

T. Ö. Rosdahl, A. Vuik, M. Kjaergaard, and A. R. Akhmerov, *Andreev rectifier: A nonlocal conductance signature of topological phase transitions*, Phys. Rev. B 97, 045421 (2018).

Jeroen Danon, Anna Birk Hellenes, Esben Bork Hansen, Lucas Casparis, Andrew P. Higginbotham, and Karsten Flensberg, *Nonlocal conductance spectroscopy of Andreev bound states: Symmetry relations and BCS charges*, arXiv:1905.05438 [cond-mat] (2019), arXiv: 1905.05438 [cond-mat].

G. C. Menard, G. L. R. Anselmetti, E. A. Martinez, D. Puglia, F. K. Malinowski, J. S. Lee, S. Choi, M. Pendharkar, C. J. Palmstrom, K. Flensberg, C. M. Marcus, L. Casparis, and A. P. Higginbotham, *Conductance-matrix symmetries of a three-terminal hybrid device*, arXiv: 1905.05505 [cond-mat] (2019), arXiv:1905.05505 [cond-mat].

Davydas Razmadze, Deividas Sabonis, Filip K. Malinowski, Gerbold C. Menard, Sebastian Pauka, Hung Nguyen, David M. T. van Zanten, Eoin C. T. O'Farrell, Judith Suter, Peter Krogstrup, Ferdinand Kuemmeth, and Charles M. Marcus, *Radio-Frequency Methods for Majorana-Based Quantum Devices: Fast Charge Sensing and Phase-Diagram Mapping*, Phys. Rev. Applied 11, 064011 (2019).

MITEQ AFS4-00100800-14-10P-4.

Appendix A—Protocol to find a topological phase in a three-terminal proximitized nanowire device.

CONCLUSION

In conclusion, one aspect of this disclosure is directed to a method to evaluate a semiconductor-superconductor heterojunction for use in a qubit register of a topological quantum computer. The method comprises: measuring one or both of a radio-frequency (RF) junction admittance of the semiconductor-superconductor heterojunction and a sub-RF conductance including a non-local conductance of the semiconductor-superconductor heterojunction, to obtain mapping data and refinement data; finding by analysis of the mapping data one or more regions of a parameter space consistent with an unbroken topological phase of the semiconductor-superconductor heterojunction; and finding by analysis of the refinement data a boundary of the unbroken topological phase in the parameter space and a topological gap of the semiconductor-superconductor heterojunction for at least one of the one or more regions of the parameter space. This method provides numerous advantageous technical effects in the building of a topological quantum computer and in the topological quantum computer so built. Among these technical effects is the effect that the qubits of the topological computer are accurately screened and tuned, for improved performance.

In some implementations the measuring in this method is enacted in first and second phases, wherein the mapping data is obtained in the first phase and the refinement data is obtained in the second phase, and wherein the second phase includes a scan of a sub-region of the one or more regions of the parameter space found by analysis of the mapping data. This variant provides the added technical effect of improved efficiency in the screening/tuning process. In some implementations the method further comprises transitioning abruptly from the first phase to the second phase in dependence on the analysis of the mapping data. In some implementations the measuring alternates between the first and second phases to effect an adaptive measurement of the parameter space. These features provide the additional technical effect of effectively concurrent exploration of the parameter space and pinpointing the topological gap in regions of interest, for improved screening and tuning performance. In some implementations the measurement is more coarsely grained in magnetic field and/or gate voltage in the first phase than in the second phase. In some implementations the method further comprises adjusting a bias-voltage range dynamically between the first phase and the second phase, to allow for bulk-gap extraction after an initial gap closing is detected. In some implementations the analysis of the mapping data includes density-based clustering on zero-bias peak data from opposite ends of the semiconductor-superconductor heterojunction. In some implementations the method further comprises validating a zero-bias peak (ZBP) in each of the one or more regions by checking stability of the ZBP to variations in cutter-gate voltage. In some implementations the analysis of the refinement data includes verifying gap closure at the boundary of each of the one or more regions of the parameter space. In some implementations the semiconductor-superconductor heterojunction is one of a series of analogously prepared semiconductor-superconductor heterojunctions, the method further comprises meta-analysis of zero-bias peak data across the series to compute a probability of finding a topological region in another analogously prepared semiconductor-superconductor heterojunction. These variants provide additional technical effects of integrating additional useful processes in the screening and tuning of topological qubits. In some implementations measuring the sub-RF conductance includes enacting local and non-local conductance measurements suitable for identifying and/or extracting an energy gap of the semiconductor-superconductor heterojunction. In some implementations the semiconductor-superconductor heterojunction comprises a semiconductor wire and at least three terminals supporting admittance and conductance measurement at opposite ends of the semiconductor wire. In some implementations the semiconductor-superconductor heterojunction comprises a plurality of electrostatic control terminals. These variants provide addition technical effects of enacting qubit screening and tuning via accessible features of the qubit structures.

Another aspect of this disclosure is directed to an instrument configured to evaluate a semiconductor-superconductor heterojunction for use in a qubit register of a topological quantum computer. The instrument comprises: a controller having a processor and computer memory coupled operatively to the processor, the controller being configured to: measure one or both of a radio-frequency (RF) junction admittance of the semiconductor-superconductor heterojunction and a sub-RF conductance including a non-local conductance of the semiconductor-superconductor heterojunction, to obtain mapping data and refinement data; find by analysis of the mapping data one or more regions of a parameter space consistent with an unbroken topological phase of the semiconductor-superconductor heterojunction; and find by analysis of the refinement data a boundary of the unbroken topological phase in the parameter space and a topological gap of the semiconductor-superconductor heterojunction for at least one of the one or more regions of the parameter space. This provides the technical effect of improved efficiency in the screening/tuning instrument.

In some implementations the instrument is coupled operatively to an RF admittance-measurement device and/or a sub-RF conductance-measurement device.

Another aspect of this disclosure is directed to a method for building a topological quantum computer. The method comprises: fabricating a semiconductor-superconductor heterojunction having at least three terminals configured to support electronic admittance testing; measuring one or both of a radio-frequency (RF) junction admittance of the semiconductor-superconductor heterojunction and a sub-RF conductance including a non-local conductance of the semiconductor-superconductor heterojunction, to obtain mapping data and refinement data; finding by analysis of the mapping data one or more regions of a parameter space consistent with an unbroken topological phase of the semiconductor-superconductor heterojunction; finding by analysis of the refinement data a boundary of the unbroken topological phase in the parameter space and a topological gap of the semiconductor-superconductor heterojunction for at least one of the one or more regions of the parameter space; and incorporating the semiconductor-superconductor heterojunction in a qubit register of the topological quantum computer provided that the found boundary and topological gap are within respective, predefined ranges. This method provides the technical effect of improved screening and tuning of the qubits of the quantum computer that is built.

In some implementations one or more values characterizing the boundary in the parameter space are used as tuning parameters for addressing the semiconductor-superconductor heterojunction in the qubit register. In some implementations the semiconductor-superconductor heterojunction is arranged in a tetron-qubit device having an additional grounding terminal, and transport through opposing regions tuned to a topological regime is measured concurrently. In some implementations the semiconductor-superconductor heterojunction is arranged in a hexon-qubit device. In some implementations the semiconductor-superconductor heterojunction is arranged in a tetron- or hexon-qubit device having a native terminal used in the method as a grounding terminal, wherein a current path through the device is used to ground individual qubits for 3-terminal-like measurements. These variants provide additional technical effects of extending the method to topological quantum-computer architectures of particular current interest in the field.

Another aspect of this disclosure is directed to a two-stage approach to the extraction of the topological phase. Significantly, this includes separation by stages whereupon a mapping phase allows for extensive search of the parameter space while still producing false positives, and a refinement stage allows for weeding out false positives slowly scanning the regions of interest from the mapping phase. Another aspect of this disclosure is directed to using density-based clustering algorithms on the two-sided ZBP data to extract predicted topological regions. Significantly, this includes clustering algorithms used for this purpose. It is believed to be the first systematic approach for finding promising regions. Another aspect of this disclosure is directed to mapping between the RF and DC conductance for the purpose of the fast conductance extraction in the RF measurement. Significantly, this includes usage of the mapping to bypass DC conductance measurement and still extract the same data but much faster due to the faster RF technique. Another aspect of this disclosure is directed to classification of bias traces using peak finding or machine learning. Significantly, this includes machine learning of topological traces and statistical characterization of how good peak finding is. Another aspect of this disclosure is directed to extraction of the gap from non-local conductance traces, specifically using bias traces together with experimental noise or filtering and smoothening of bias/field scans. Significantly, this includes the automatic gap extraction. Another aspect of this disclosure is directed to improvement of the accuracy of previous methods by checking for gap closing at the boundary of the suspect topological region. Significantly, this includes application of the extraction of the gap from the data to classify the regions into topological/trivial ones. Another aspect of this disclosure is directed to meta-analysis of the ZBP data to extract the probability of finding topological regions across many devices of the same preparation. This can be used in order to characterize the growth/fabrication method via a topological phase diagram.

Another aspect of this disclosure is directed to using any of the above to tune up a qubit of a topological quantum computer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method to evaluate a semiconductor-superconductor heterojunction for use in a qubit register of a topological quantum computer, the method comprising:
measuring one or both of a radio-frequency (RF) junction admittance of the semiconductor-superconductor heterojunction and a sub-RF conductance including a non-local conductance of the semiconductor-superconductor heterojunction, to obtain mapping data and refinement data, wherein said measuring is enacted in first and second phases, wherein the mapping data is obtained in the first phase and the refinement data is obtained in the second phase, and wherein the second phase includes a scan of a sub-region of one or more regions of a parameter space found by analysis of the mapping data;
transitioning abruptly from the first phase to the second phase in dependence on the analysis of the mapping data;
finding by the analysis of the mapping data one or more regions of the parameter space consistent with an unbroken topological phase of the semiconductor-superconductor heterojunction; and
finding by analysis of the refinement data a boundary of the unbroken topological phase in the parameter space and a topological gap of the semiconductor-superconductor heterojunction for at least one of the one or more regions of the parameter space.

2. The method of claim 1 wherein said measuring alternates between the first and second phases to effect an adaptive measurement of the parameter space.

3. The method of claim 1 wherein said measurement is more coarsely grained in magnetic field and/or gate voltage in the first phase than in the second phase.

4. The method of claim 1 further comprising adjusting a bias-voltage range dynamically between the first phase and the second phase, to allow for bulk-gap extraction after an initial gap closing is detected.

5. The method of claim 1 wherein the analysis of the mapping data includes density-based clustering on zero-bias peak data from opposite ends of the semiconductor-superconductor heterojunction.

6. The method of claim 1 further comprising validating a zero-bias peak (ZBP) in each of the one or more regions by checking stability of the ZBP to variations in cutter-gate voltage.

7. The method of claim 1 wherein the analysis of the refinement data includes verifying gap closure at the boundary of each of the one or more regions of the parameter space.

8. The method of claim 1 wherein the semiconductor-superconductor heterojunction is one of a series of analogously prepared semiconductor-superconductor heterojunctions, the method further comprising meta-analysis of zero-bias peak data across the series to compute a probability of finding a topological region in another analogously prepared semiconductor-superconductor heterojunction.

9. The method of claim 1 wherein measuring the sub-RF conductance includes enacting local and non-local conductance measurement suitable for identifying and/or extracting an energy gap of the semiconductor-superconductor heterojunction.

10. The method of claim 1 wherein the semiconductor-superconductor heterojunction comprises a semiconductor wire and at least three terminals supporting admittance and conductance measurement at opposite ends of the semiconductor wire.

11. The method of claim 1 wherein the semiconductor-superconductor heterojunction comprises a plurality of electrostatic control terminals.

12. An instrument configured to evaluate a semiconductor-superconductor heterojunction for use in a qubit register of a topological quantum computer, the instrument comprising:
a controller having a processor and computer memory coupled operatively to the processor, the controller being configured to:
measure one or both of a radio-frequency (RF) junction admittance of the semiconductor-superconductor heterojunction and a sub-RF conductance including a non-local conductance of the semiconductor-superconductor heterojunction, to obtain mapping data and refinement data, wherein measuring is enacted in first and second phases, wherein the mapping data is obtained in the first phase and the refinement data is obtained in the second phase, and wherein the second phase includes a scan of a sub-region of one or more regions of a parameter space found by analysis of the mapping data;
transition abruptly from the first phase to the second phase in dependence on the analysis of the mapping data;
find by the analysis of the mapping data one or more regions of the parameter space consistent with an unbroken topological phase of the semiconductor-superconductor heterojunction; and
find by analysis of the refinement data a boundary of the unbroken topological phase in the parameter space and a topological gap of the semiconductor-superconductor heterojunction for at least one of the one or more regions of the parameter space.

13. The instrument of claim 12 wherein the instrument is coupled operatively to an RF admittance-measurement device and/or a sub-RF conductance-measurement device.

14. A method for building a topological quantum computer, the method comprising:
fabricating a semiconductor-superconductor heterojunction having at least three terminals configured to support electronic admittance testing;
measuring one or both of a radio-frequency (RF) junction admittance of the semiconductor-superconductor heterojunction and a sub-RF conductance including a non-local conductance of the semiconductor-superconductor heterojunction, to obtain mapping data and refinement data, wherein said measuring is enacted in first and second phases, wherein the mapping data is obtained in the first phase and the refinement data is obtained in the second phase, and wherein the second phase includes a scan of a sub-region of one or more regions of a parameter space found by analysis of the mapping data;

transitioning abruptly from the first phase to the second phase in dependence on the analysis of the mapping data;

finding by the analysis of the mapping data one or more regions of the parameter space consistent with an unbroken topological phase of the semiconductor-superconductor heterojunction;

finding by analysis of the refinement data a boundary of the unbroken topological phase in the parameter space and a topological gap of the semiconductor-superconductor heterojunction for at least one of the one or more regions of the parameter space; and incorporating the semiconductor-superconductor heterojunction in a qubit register of the topological quantum computer provided that the found boundary and topological gap are within respective, predefined ranges.

15. The method of claim 14 wherein one or more values characterizing the boundary in the parameter space are used as tuning parameters for addressing the semiconductor-superconductor heterojunction in the qubit register.

16. The method of claim 14 wherein the semiconductor-superconductor heterojunction is arranged in a tetron-qubit device having an additional grounding terminal, and wherein transport through opposing regions tuned to a topological regime is measured concurrently.

17. The method of claim 14 wherein the semiconductor-superconductor heterojunction is arranged in a hexon-qubit device.

18. The method of claim 14 wherein the semiconductor-superconductor heterojunction is arranged in a tetron- or hexon-qubit device having a native terminal used in the method as a grounding terminal, wherein a current path through the device is used to ground individual qubits for 3-terminal-like measurements.

* * * * *